United States Patent
Wang et al.

(10) Patent No.: US 10,879,240 B2
(45) Date of Patent: Dec. 29, 2020

(54) FIN FIELD EFFECT TRANSISTOR (FINFET) DEVICE STRUCTURE

(71) Applicant: Taiwan Semiconductor Manufacturing Co., Ltd., Hsinchu (TW)

(72) Inventors: Chun-Chieh Wang, Kaohsiung (TW); Zheng-Yang Pan, Zhubei (TW); Shih-Chieh Chang, Taipei (TW); Yi-Min Huang, Tainan (TW); Shahaji B. More, Hsinchu (TW); Tsung-Lin Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 87 days.

(21) Appl. No.: 15/356,004

(22) Filed: Nov. 18, 2016

(65) Prior Publication Data
US 2018/0145076 A1 May 24, 2018

(51) Int. Cl.
*H01L 27/092* (2006.01)
*H01L 21/8238* (2006.01)
*H01L 29/10* (2006.01)
*H01L 29/78* (2006.01)
*H01L 21/762* (2006.01)
*H01L 29/66* (2006.01)

(52) U.S. Cl.
CPC .... *H01L 27/0924* (2013.01); *H01L 21/76224* (2013.01); *H01L 21/823807* (2013.01); *H01L 21/823821* (2013.01); *H01L 29/1054* (2013.01); *H01L 29/66818* (2013.01); *H01L 29/785* (2013.01); *H01L 21/823878* (2013.01); *H01L 21/823892* (2013.01)

(58) Field of Classification Search
CPC ........................................................ H01L 27/092
USPC ................................................. 257/365–369
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |

(Continued)

OTHER PUBLICATIONS

U.S. Notice of Allowance issued in U.S. Appl. No. 15/356,252 dated Aug. 16, 2017.

*Primary Examiner* — Marvin Payen
(74) *Attorney, Agent, or Firm* — Birch, Stewart, Kolasch & Birch, LLP

(57) ABSTRACT

A fin field effect transistor (FinFET) device structure and method for forming the same are provided. The FinFET device structure includes a fin structure extending above a substrate. The fin structure includes a channel region, a portion of the channel region is made of silicon germanium (SiGe), and the silicon germanium (SiGe) has a gradient germanium (Ge) concentration. The FinFET device structure includes a gate structure formed on the channel region of the fin structure.

20 Claims, 19 Drawing Sheets

(56) References Cited

U.S. PATENT DOCUMENTS

| | | | |
|---|---|---|---|
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 2002/0105015 A1* | 8/2002 | Kubo | H01L 21/8238 257/285 |
| 2006/0148220 A1* | 7/2006 | Lindert | H01L 21/26506 438/514 |
| 2008/0157119 A1* | 7/2008 | Tsai | H01L 29/165 257/190 |
| 2013/0285153 A1 | 10/2013 | Lee et al. | |
| 2014/0117462 A1* | 5/2014 | Cheng | H01L 29/66803 257/410 |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2014/0353731 A1* | 12/2014 | Colinge | H01L 29/7843 257/288 |
| 2015/0236021 A1* | 8/2015 | Basker | H01L 27/0924 257/369 |
| 2015/0263003 A1 | 9/2015 | Lee et al. | |
| 2015/0311341 A1* | 10/2015 | Hur | H01L 21/02532 257/190 |
| 2017/0005002 A1* | 1/2017 | Ching | H01L 29/161 |

\* cited by examiner

FIN FIELD EFFECT TRANSISTOR (FINFET) DEVICE STRUCTURE

CROSS REFERENCE TO RELATED APPLICATIONS

This application is related to the following commonly assigned patent application: U.S. patent application Ser. No. 15/356,252, filed on Nov. 18, 2016, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer-technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
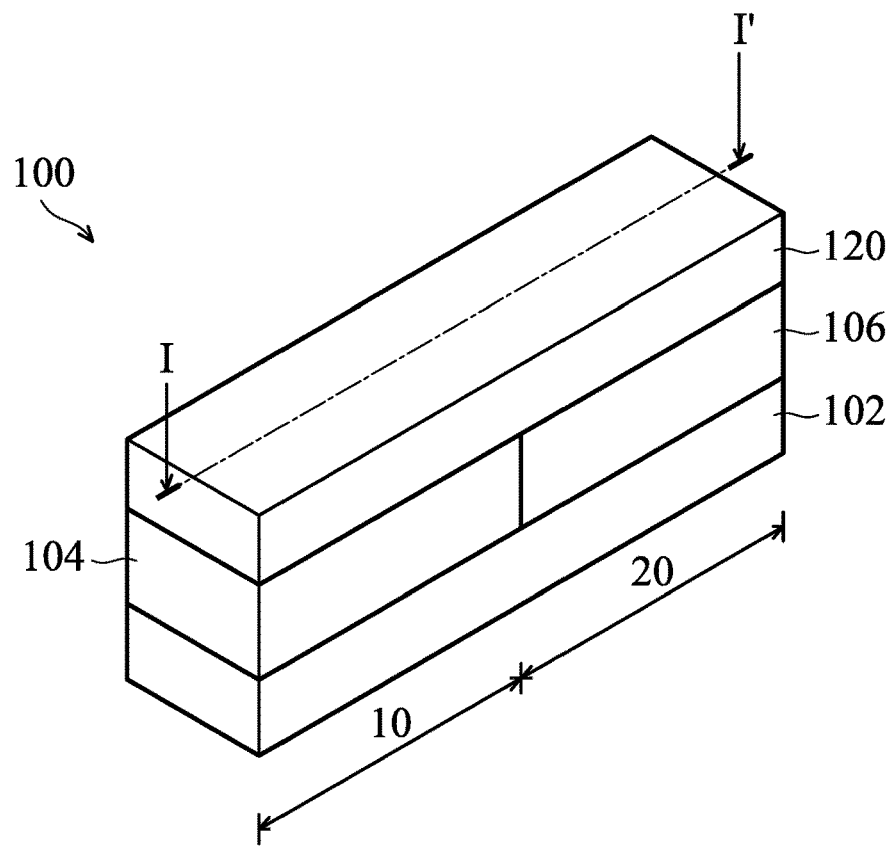
FIGS. 1A-1J show three-dimensional representations of forming a fin field effect transistor (FinFET) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIGS. 1A-1J show three-dimensional representations of forming a fin field effect transistor (FinFET) device structure 100, in accordance with some embodiments of the disclosure.

As shown in FIG. 1A, the FinFET device structure 100 includes a substrate 102. The substrate 102 includes a first region 10 and a second region 20. In some embodiments, a PMOS device is formed in the first region 10, and a NMOS device is formed in the second region 20. The substrate 102 may be made of silicon or another semiconductor material. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A first well region 104 is formed on the substrate 102 in the first region 10 and a second well region 106 is formed on the substrate 102 in the second region 20. In some embodiments, first well region 104 is an N-well region, and the second well region 106 is the P-well region. A photoresist (not shown) is formed on the first region 10 of the substrate 102, and an ion implantation process is performed on the second region 20 to form the second well region 106. A photoresist (not shown) is formed on the second region 20 of the substrate 102, and an ion implantation process is performed on the first region 10 to form the first well region 104. In some embodiments, the first well region 104 is doped with arsenic (As) or phosphorous (P) ions to form the N-well region. In some embodiments, the second well region 106 is doped with boron (B) ions to form the P-well region.

Afterwards, a second material layer 120 is formed on the first well region 104 and the second well region 106. In some embodiments, the second material layer 120 is made of silicon (Si). In some embodiments, the second material layer 120 is grown on the first well region 104 and the second well region 106 by a chemical vapor deposition (CVD) process. The second material layer 120 made of silicon (Si) is formed by using silane ($SiH_4$), or disilane ($Si_2H_6$) as a source.

Figure 1B:
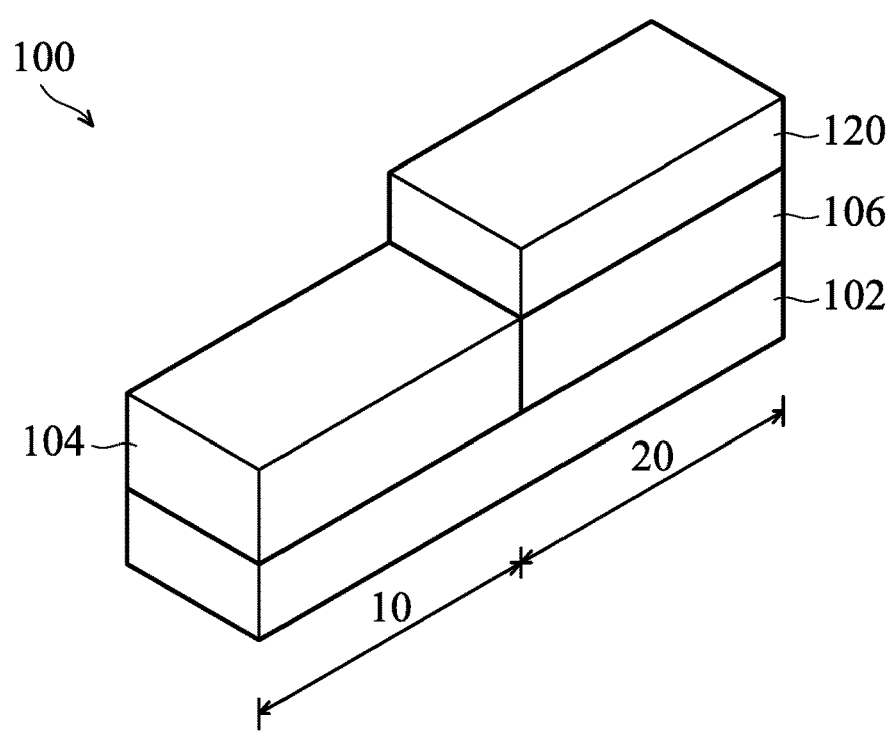

As shown in FIG. 1B, after the second material layer 120 is formed, a portion of the second material layer 120 is removed in the first region 10, in accordance with some embodiments of the disclosure. As a result, a top surface of the first well region 104 is exposed. In some embodiments, the portion of the second material layer 120 is removed by an etching process, such as wet etching process or dry etching process.

Figure 1C:
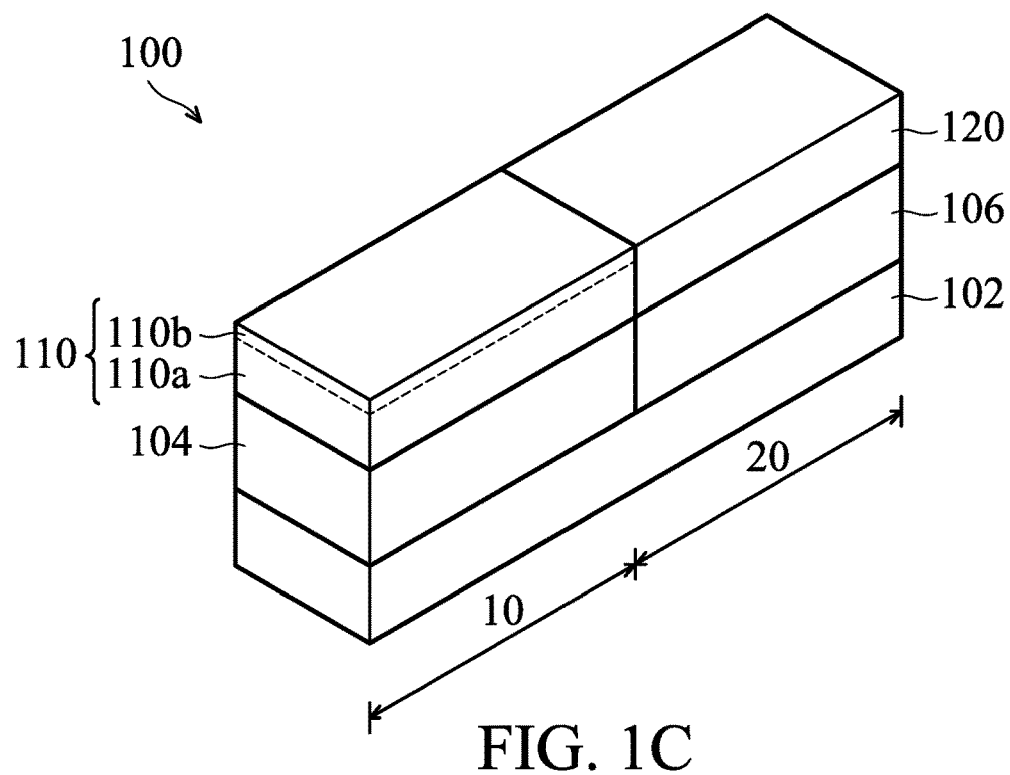

As shown in FIG. 1C, the first material layer 110 is formed on the first well region 104 in the first region 10, in accordance with some embodiments of the disclosure.

The first material layer 110 and the second material layer 120 are made of different materials. In some embodiments, the first material layer 110 is made of silicon germanium (SiGe), and the second material layer 120 is made of silicon (Si). A portion of the silicon germanium (SiGe) below a gate structure in the first region 10 is used as a channel region. The silicon germanium (SiGe) having compressive stress is suitable for providing increased carrier speed, i.e., increased hole carrier speed, for the channel region of P-type FinFET (PMOS device). The strained silicon (Si) material having tensile stress is suitable for the channel region of N-type FinFET (NMOS device).

The first material layer 110 includes a first portion 110a and a second portion 110b. The junctions or boundaries (shown in dash lines) between the first portion 110a and second portion 110b are not clearly defined and are more "blurred". There is no actual interface or boundary between the first portion 110a and second portion 110b.

In some embodiments, the first portion 110a is made of silicon germanium (SiGe) having a gradient germanium (Ge) concentration. The second portion 110b is made of silicon germanium (SiGe) having constant germanium (Ge) concentration. The gradient germanium (Ge) concentration is gradually increased from a bottom surface of the first portion 110a to a top surface of the first portion 110a of the first material layer. In some embodiments, the gradient germanium (Ge) concentration is gradually increased from about 10 atomic % to about 35 atomic %.

It should be noted that the germanium (Ge) concentration is gradually increased as the deposited thickness of the first portion 110a of the first material layer 110 is increased. The adjacent silicon germanium (SiGe) materials with a small concentration difference have a small lattice mismatch, and therefore the misfit or dislocation defects are minimized. In addition, the wiggled or bent profiles or shapes of the fin structures 11, 12 (shown in FIG. 1E) may be reduced since the defects of the first material layer 110 is minimized.

In some embodiments, the second portion 110b of the first material layer 110 has about 35 atomic % germanium (Ge) concentration. The second portion 110b is designed at a constant concentration to improve the stability of the threshold voltage ($V_{th}$) of the transistor device.

The first portion 110a of the first material layer 110 has a first thickness $T_1$, and the second portion 110b of the first material layer 110 has a second thickness $T_2$. The first material layer 110 has a thickness $T_3$ which is the sum of the first thickness $T_1$ and the second thickness $T_2$. In some embodiments, a ratio of the second thickness $T_2$ to the first thickness $T_1$ is in a range from about 1% to about 10%. When the ratio is in the above-mentioned range, the stability of the threshold voltage ($V_{th}$) of the transistor device is improved. In addition, the defects of the first material layer 110 are decreased.

The first portion 110a and the second portion 110b is a single layer and is formed in the same chamber. The first material layer 110 is formed by chemical vapor deposition (CVD), physical vapor deposition, (PVD), atomic layer deposition (ALD), spin-on coating, or another applicable process. The SiGe material is formed by mixing a silicon-containing precursor compound and a germanium-containing precursor compound into a chamber to perform a deposition process. The silicon-containing precursor compound includes tetraethoxysilane (TEOS), silane ($SiH_4$), disilane ($Si_2H_6$), trisilane ($Si_3H_8$), dichlorosilane (DCS) ($Si_2H_2Cl_2$), other suitable silicon-containing precursor gases, or a combination thereof. The germanium-containing precursor compound includes germane ($GeH_4$), digermane ($Ge_2H_6$), germanium tetrachloride ($GeCl_4$), germanium dichloride ($GeCl_2$), other suitable germanium-containing precursor gases, or a combination thereof. The gradient germanium (Ge) concentration is formed by controlling the ratio of the flow rate of silicon-containing precursor compound and the germanium-containing precursor compound.

Figure 1D:
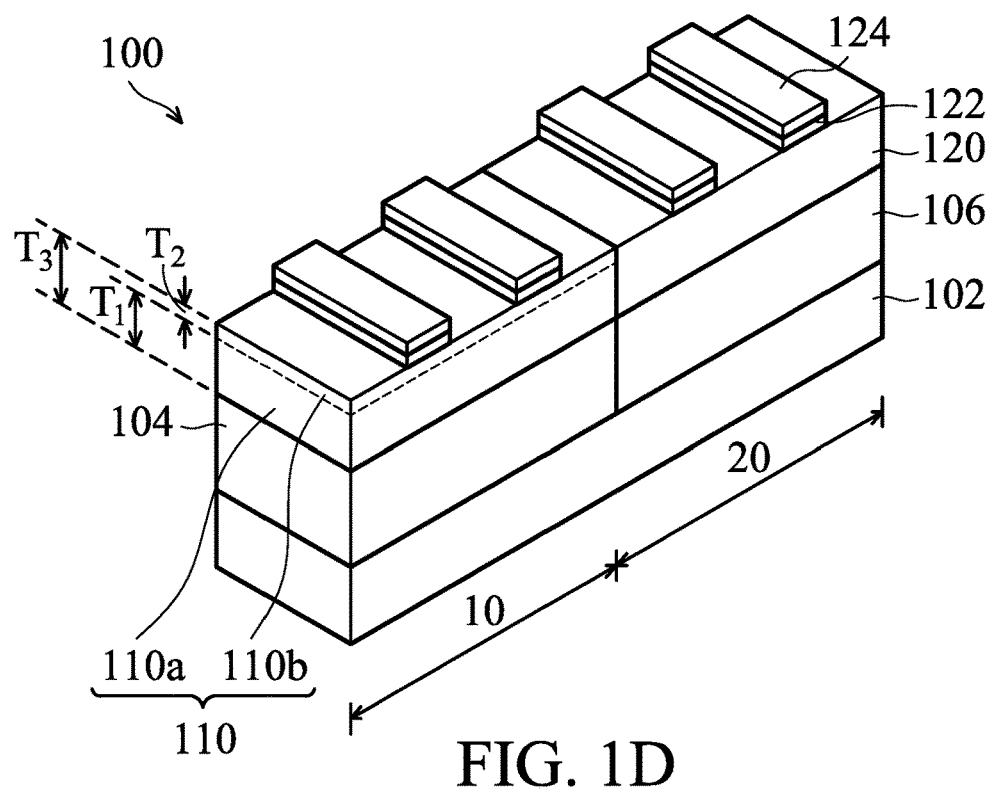

As shown in FIG. 1D, an oxide layer 122 is formed on the first material layer 110 and the second material layer 120, in accordance with some embodiments of the disclosure. In some embodiments, the oxide layer 122 is made of silicon oxide. The oxide layer 122 is formed by deposition processes, such as a chemical vapor deposition (CVD) process, a high-density plasma chemical vapor deposition (HDPCVD) process, a spin-on process, a sputtering process, or another applicable process.

A hard mask layer 124 is formed on the oxide layer 122. The hard mask 124 may be made of silicon oxide, silicon nitride, silicon oxynitride, or another applicable material. In some other embodiments, more than one hard mask layer 124 is formed on the oxide layer 122. The hard mask layer 124 is formed by deposition processes, such as a chemical vapor deposition (CVD) process, a high-density plasma chemical vapor deposition (HDPCVD) process, a spin-on process, a sputtering process, or another applicable process.

Afterwards, the oxide layer 122 and the hard mask layer 124 are patterned by a patterning process to form a patterned oxide layer 122 and a patterned hard mask layer 124. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

Figure 1E:
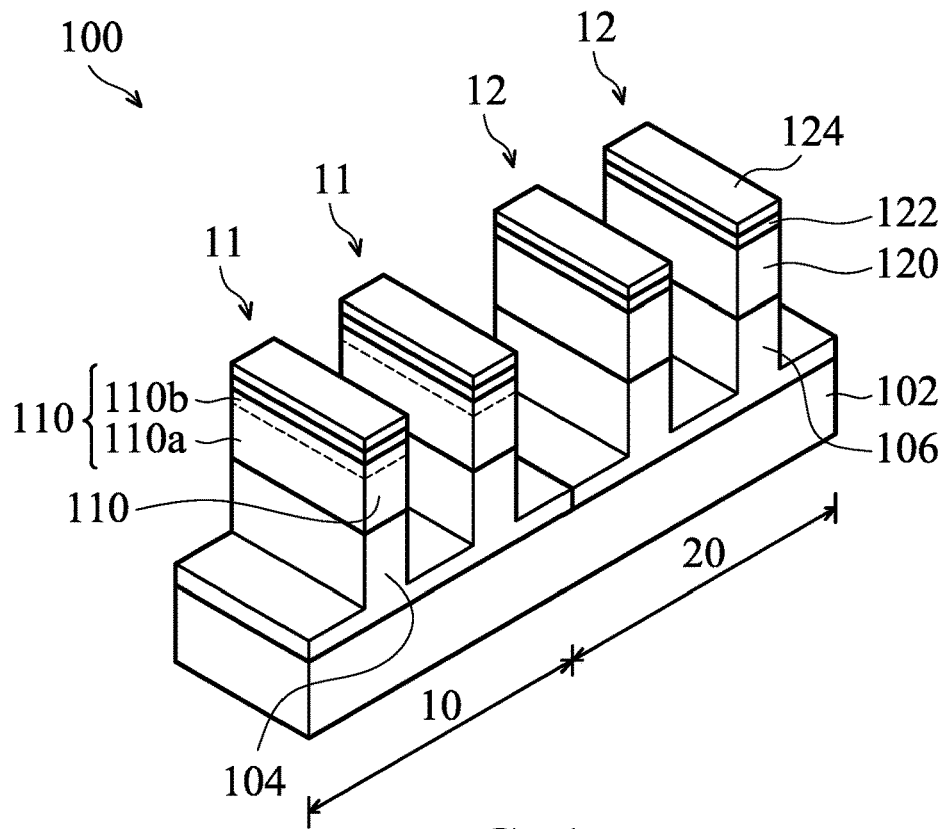

As shown in FIG. 1E, an etching process is performed on the first material layer 110, the first well region 104, the second material layer 120 and the second well region 106 to form a first fin structure 11 and a second fin structure 12, in accordance with some embodiments of the disclosure. The first fin structure 11 and the second fin structure 12 are formed by using the patterned oxide layer 122 and the patterned hard mask layer 124 as a mask. The etching process may be a dry etching process or a wet etching process.

The first fin structure 11 includes the first portion 110a, the second portion 110b, and the first well region 104. The second fin structure 12 includes the second material layer 120, and the second well region 106.

It should be noted that the number of first fin structures 11 and the number of second fin structures 12 may be adjusted according to actual application, and it is not limited to two first fin structures 11 in the first region 10 and two second fin structures 12 in the second region 20.

Figure 1F:
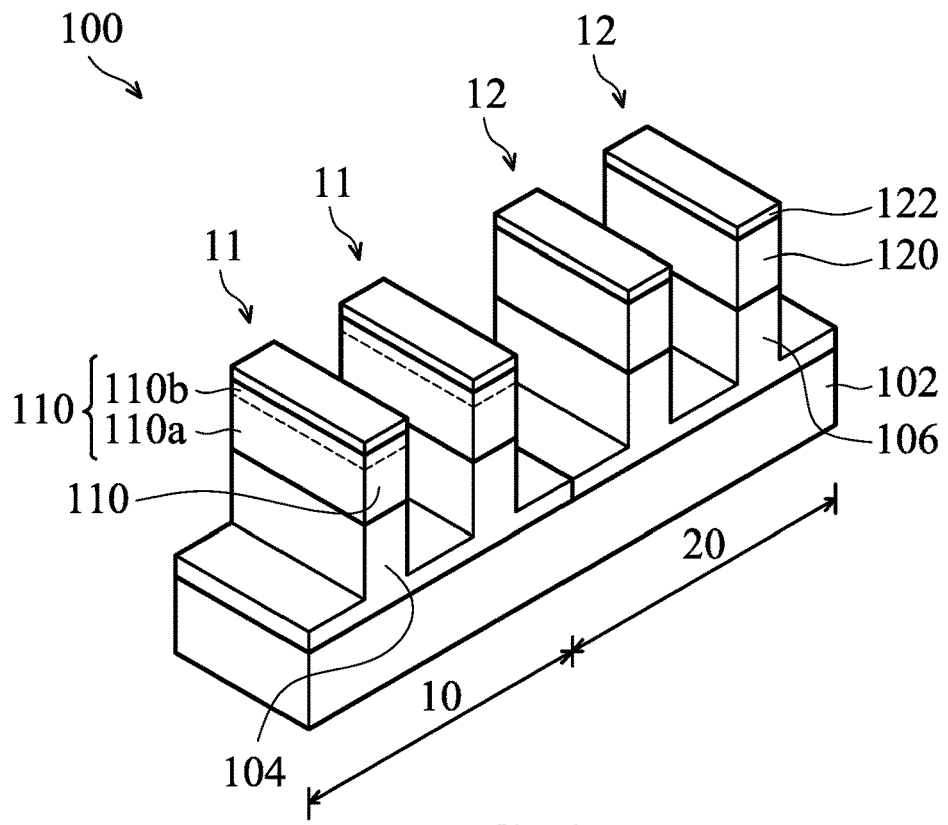

As shown in FIG. 1F, the patterned hard mask layer 124 is removed, in accordance with some embodiments of the disclosure. The patterned hard mask layer 124 is removed by an etching process, such as a dry etching process or wet etching process.

Figure 1G:
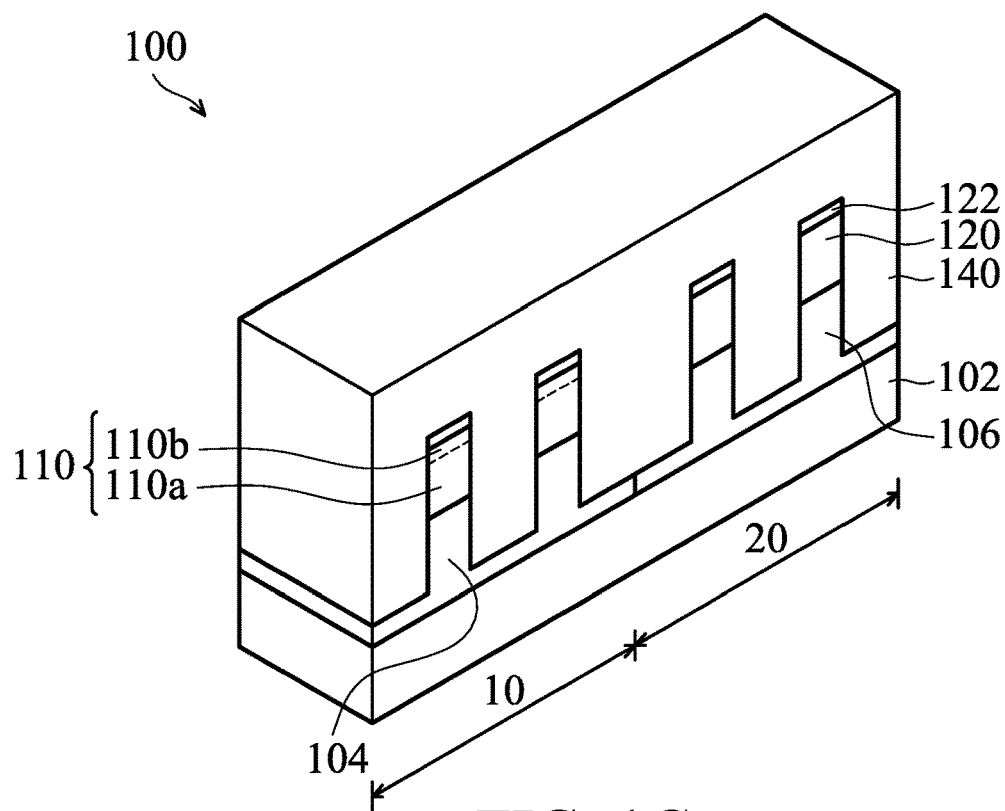

As shown in FIG. 1G, a dielectric layer 140 is formed on the first fin structure 11 and the second fin structure 12, in accordance with some embodiments. In some embodiments, a dielectric material is deposited on the first fin structure 11, and the second fin structure 12, and afterwards an anneal process is performed on the dielectric material. During the anneal process, the dielectric material is transformed from liquid form into solid form to form the dielectric layer 140. In some embodiments, a rapid thermal annealing (RTA) process is performed on the dielectric material.

The dielectric layer 140 may be made of one or more dielectric materials, such as silicon oxide, silicon nitride, low-k dielectric materials. The dielectric layer 140 may be deposited by a chemical vapor deposition (CVD) process, a spin-on-glass process, or another applicable process.

Figure 1H:
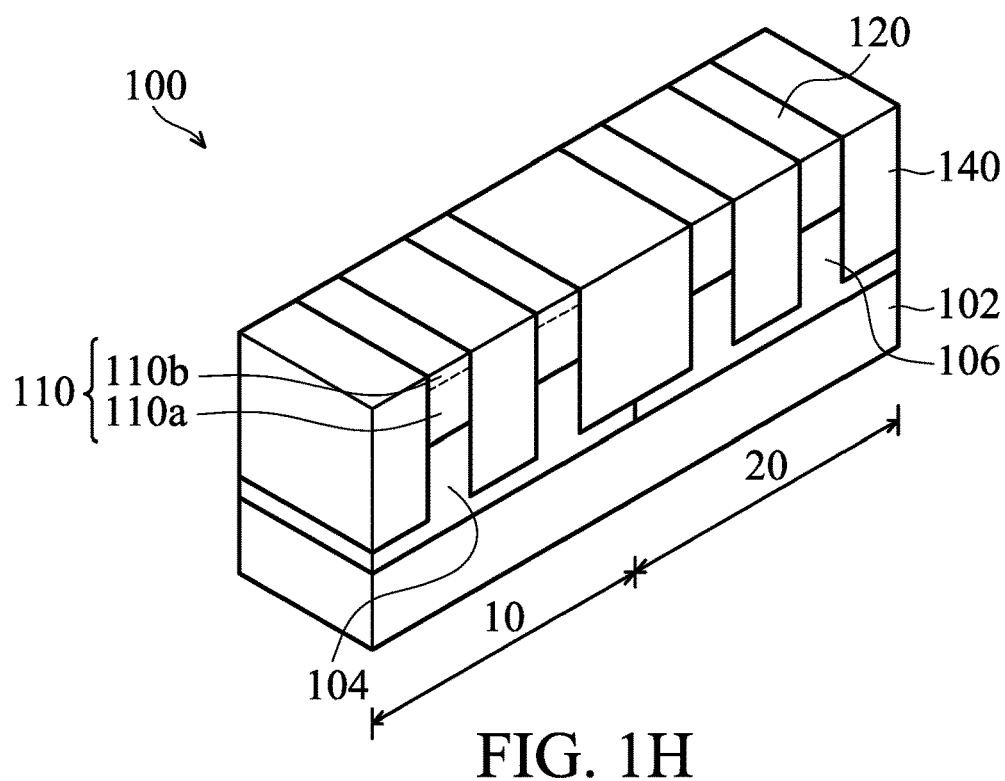

As shown in FIG. 1H, the dielectric layer 140 is thinned or planarized until a top surface of the dielectric layer 140 is level with a top surface of the first material layer 110 and a top surface of the second material layer 120, in accordance with some embodiments. In addition, the patterned oxide layer 122 is removed. In some embodiments, the dielectric layer 140 is thinned by a chemical mechanical polishing (CMP) process.

Figure 1I:
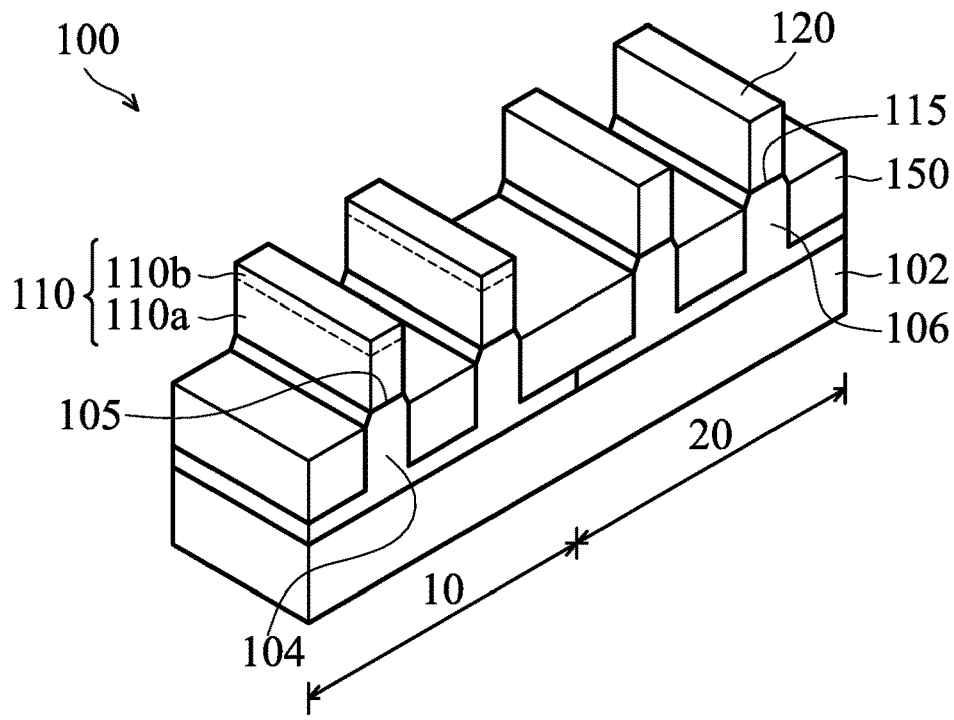

As shown in FIG. 1I, a portion of the dielectric layer 140 is removed to expose the first material layer 110 in the first region 10 and the second material layer 120 in the second region 20, in accordance with some embodiments. As a result, an isolation structure 150 is formed. The dielectric layer 140 is removed by an etching process, such as a dry etching process or a wet etching process.

A first interface 105 between the first well region 104 and the first material layer 110 is higher than a top surface of the isolation structure 150. A second interface 115 between the second well region 106 and the second material layer 120 is higher than the top surface of the isolation structure 150. The first material layer 110 and a portion of the first well region 104 protrude from the isolation structure 150. The second material layer 120 and a portion of the second well region 106 protrude from the isolation structure 150.

Figure 1J:
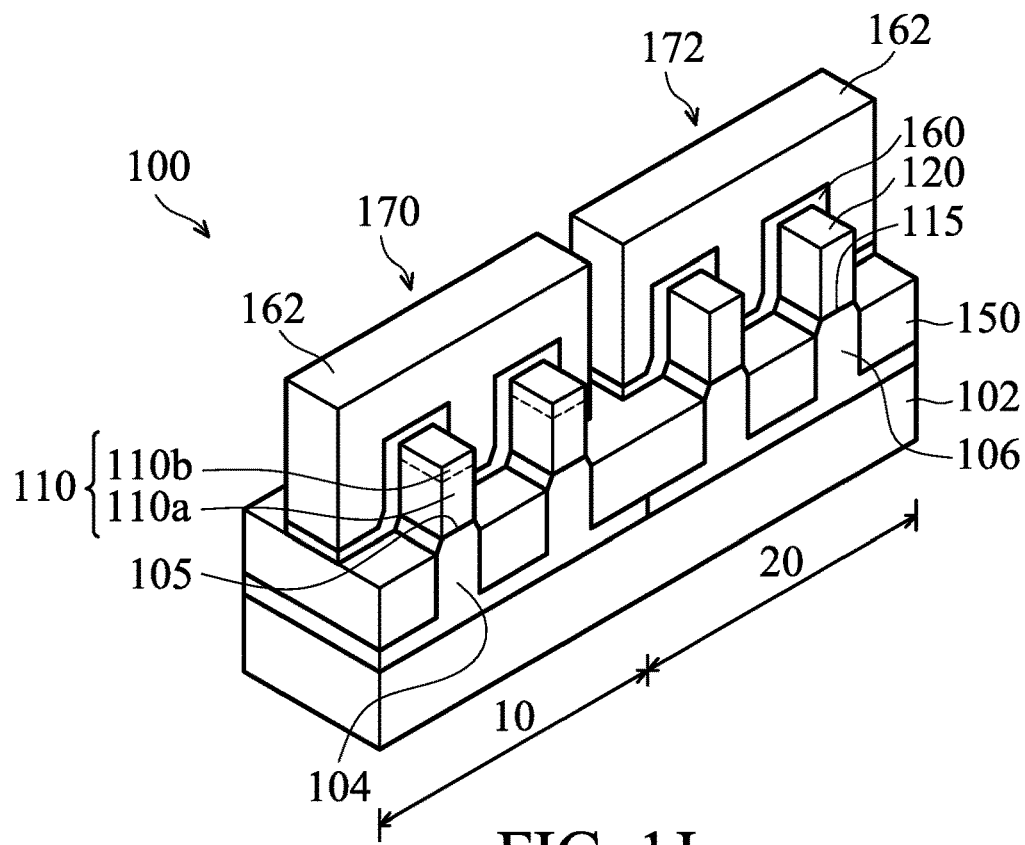

As shown in FIG. 1J, a gate dielectric layer 160 and a gate electrode layer 162 are formed on the first material layer 110, the second material layer 120 and the isolation structure 150, in accordance with some embodiments. As a result, a first gate structure 170 is formed on the middle portion of the first fin structure 11 in the first region 10, and a second gate structure 172 is formed on the middle portion of the second fin structure 12 in the second region 20.

The middle portion of the first fin structure 11 which is surrounded or wrapped by the first gate structure 170 is the channel region. The middle portion of the second fin structure 12 which is surrounded or wrapped by the second gate structure 172 is the channel region. The channel region in the first region 10 includes a portion of the second portion 110b, and a portion of the first portion 110a. The second portion 110b of the first material layer 110 is made of silicon germanium (SiGe) having a gradient germanium (Ge) concentration. The gradient germanium (Ge) concentration is gradually decreased from an interface between the first portion 110a and the second portion 110b to a bottom surface of the first portion 110a. In other words, the gradient germanium (Ge) concentration is gradually increased from a bottom surface of the channel region to a top surface of the channel region.

In some embodiments, the gate dielectric layer 160 is made of dielectric materials, such as silicon oxide, silicon nitride, silicon oxynitride, dielectric material with high dielectric constant (high-k), or a combination thereof. The gate dielectric layer 160 is formed by a deposition process, such as chemical vapor deposition (CVD), physical vapor deposition (PVD), atomic layer deposition (ALD), high density plasma CVD (HDPCVD), metal organic CVD (MOCVD), plasma enhanced CVD (PECVD) or another applicable process.

In some embodiments, the gate electrode layer 162 is made of conductive or non-conductive materials. In some embodiments, the gate electrode layer 162 is made of polysilicon. The gate electrode layer 162 is formed by a deposition process, such as chemical vapor deposition (CVD), physical vapor deposition (PVD), atomic layer deposition (ALD), high density plasma CVD (HDPCVD), metal organic CVD (MOCVD), plasma enhanced CVD (PECVD), or another applicable process.

Afterwards, a portion of the first material layer 110 adjacent to the first dummy gate structure 170 is removed to form a recess (not shown), and a source/drain (S/D) structure is formed in the recess. A portion of the second material 120 adjacent to the second gate structure 172 is removed to form a recess (not shown), and a source/drain (S/D) structure is formed in the recess.

In some embodiments, the source/drain structures include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof.

The inter-dielectric layer (ILD) structure is formed adjacent to the first gate structure 170, the second gate structure 172 and the source/drain structures. Therefore, a p-type FinFET (PMOS device) is formed in the first region 10, and an N-type FinFET (NMOS device) is formed in the second region 20.

In some embodiments, the gradient germanium (Ge) concentration is gradually increased from about 10 atomic % to about 35 atomic %. The mobility of the channel region is increased as the germanium (Ge) concentration is increased. However, the high germanium (Ge) concentration is not easily grown on the first well region 104 made of doped-silicon due to the lattice mismatch. When the gradient germanium (Ge) concentration is gradually increased from about 10 atomic % to about 35 atomic %, the misfit or dislocation defects are minimized, and the first portion 110a of the first material layer 110 with high germanium (Ge) concentration (such as 35 atomic %) is close to the gate structures 170, 172 to enhance mobility of the PMOS device in the first region 10.

It should be noted that the second portion 110b of the first material layer 110 has a constant germanium (Ge) concentration. In some embodiments, the second portion 110b of the first material layer 110 has 35 atomic % germanium (Ge) concentration. The second portion 110b is designed to have a constant concentration to improve the stability of the threshold voltage ($V_{th}$) of the transistor device.

Figure 2A:
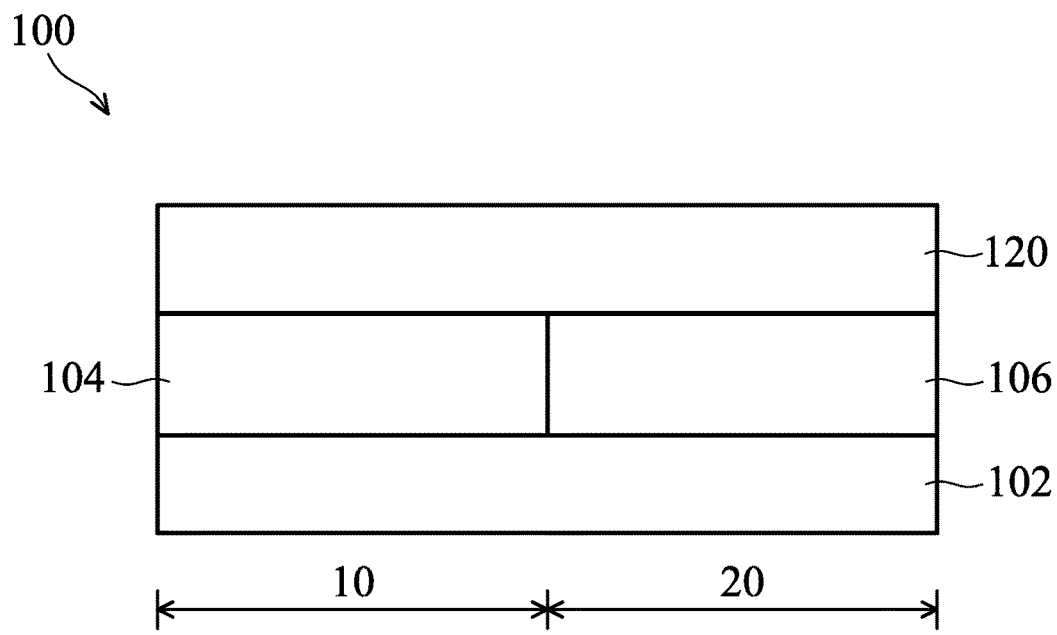
FIGS. 2A-2J show cross-sectional representations of forming a fin field effect transistor (FinFET) device structure, in accordance with some embodiments of the disclosure.

FIGS. 2A-2J show cross-sectional representations of forming a fin field effect transistor (FinFET) device structure 100, in accordance with some embodiments of the disclosure. FIG. 2A is cross-sectional representation taken along I-I' line of FIG. 1A.

A shown in FIG. 2A, the first well region 104 and the second well region 106 are formed on the substrate 102, and the second material layer 120 is formed on the first well region 104 and the second well region 106.

Figure 2B:
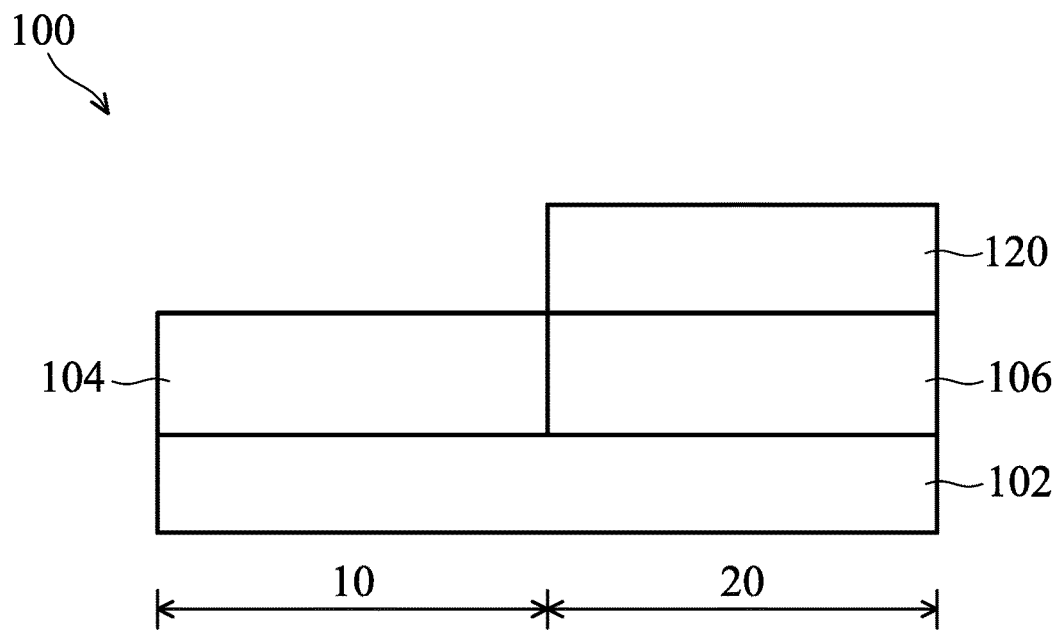

As shown in FIG. 2B, a portion of the second material layer 120 is removed to expose a top surface of the first well region 104, in accordance with some embodiments of the disclosure.

Figure 2C:
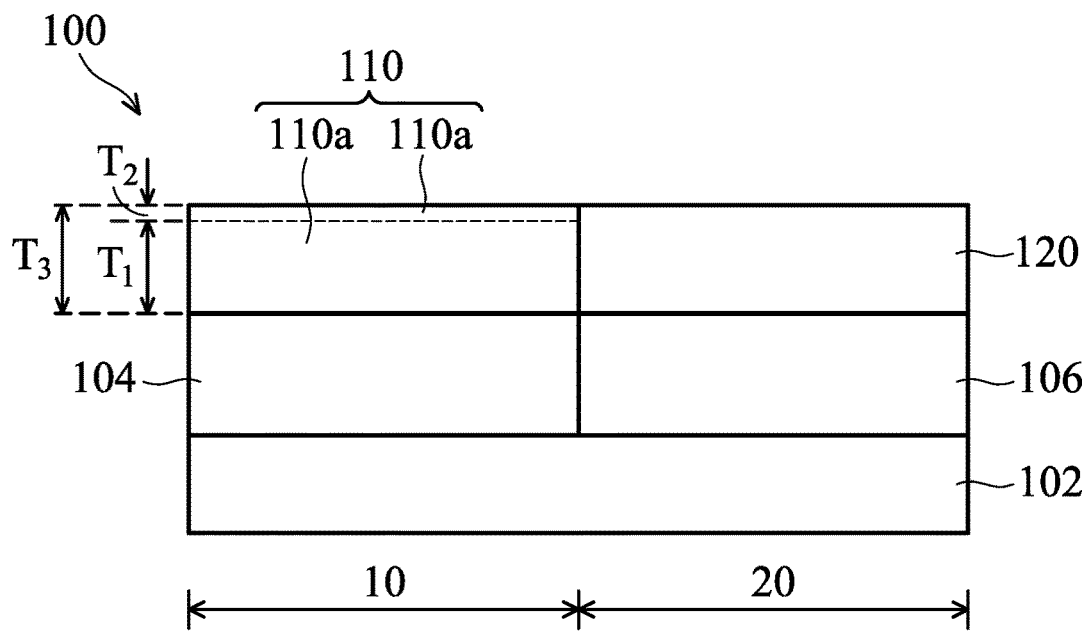

As shown in FIG. 2C, afterwards, the first material layer 110 is formed on the first well region 104 in the first region 10, in accordance with some embodiments of the disclosure. The first material layer 110 includes a first portion 110a and a second portion 110b above the first portion 110a.

In some embodiments, the first portion 110a is made of silicon germanium (SiGe) having gradient germanium (Ge) concentration. The second portion 110b is made of silicon germanium (SiGe) having constant germanium (Ge) concentration. The gradient germanium (Ge) concentration is gradually increased from a bottom surface of the first portion 110a to a top surface of the first portion 110a of the first material layer. In some embodiments, the gradient germanium (Ge) concentration is gradually increased from about 10 atomic % to about 35 atomic %.

Figure 2D:
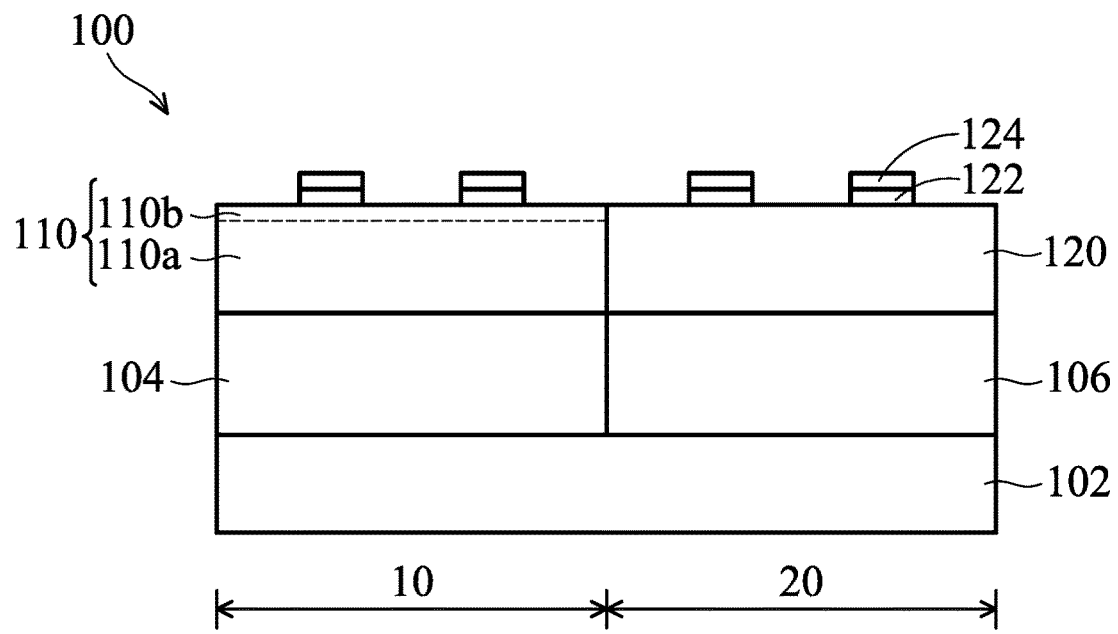

As shown in FIG. 2D, the oxide layer 122 is formed on the first material layer 110 and the second material layer 120, and the hard mask layer 124 is formed on the oxide layer 122, in accordance with some embodiments of the disclosure. Afterwards, the oxide layer 122 and the hard mask layer 124 are patterned to form the patterned oxide layer 122 and the patterned hard mask layer 124.

Figure 2E:
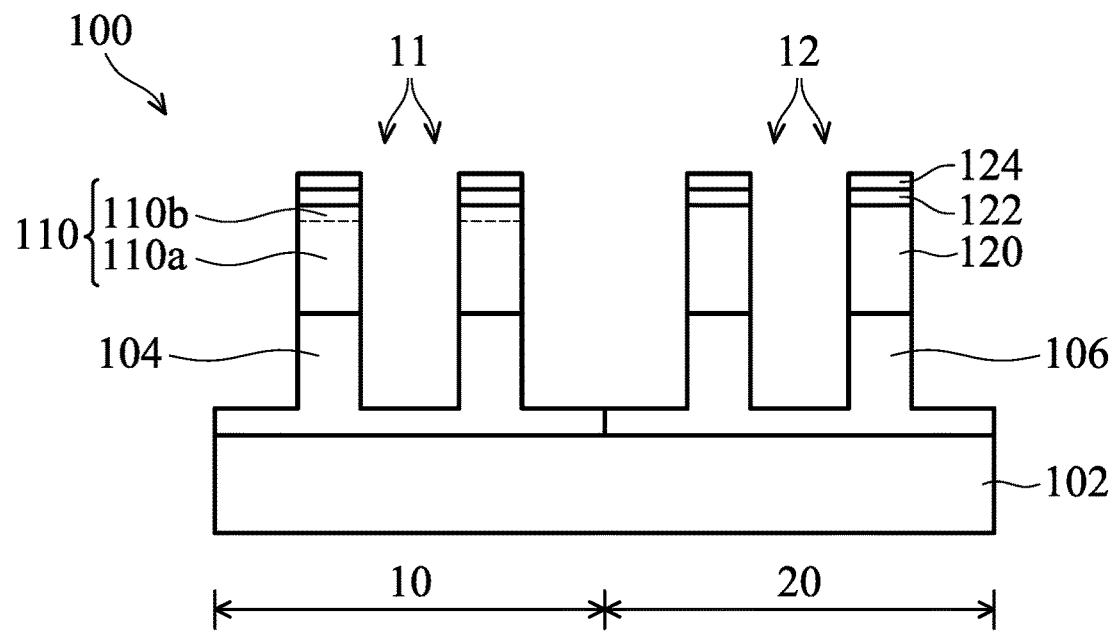

As shown in FIG. 2E, a portion of the first material layer 110, a portion of the first well region 104, a portion of the second material layer 120, and a portion of the second well region 106 are removed, in accordance with some embodiments of the disclosure. As a result, the first structure 11 includes the first well region 104 and the first material layer 110, and the second fin structure 12 includes the second well region 106 and the second material layer 120.

Figure 2F:
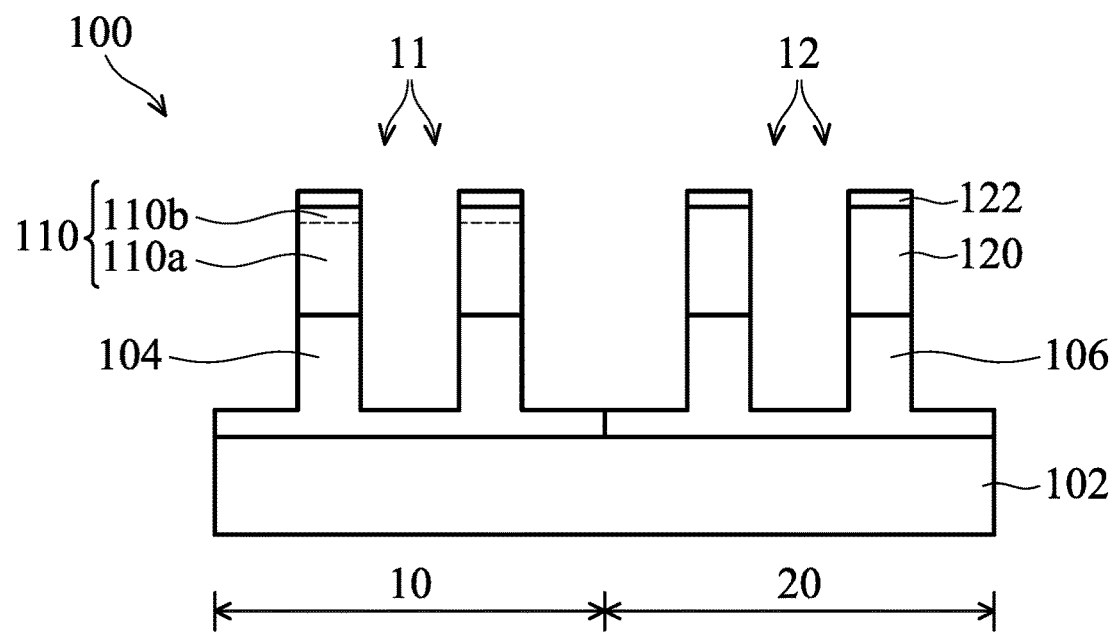

As shown in FIG. 2F, the patterned hard mask layer 124 is removed, in accordance with some embodiments of the disclosure.

Figure 2G:
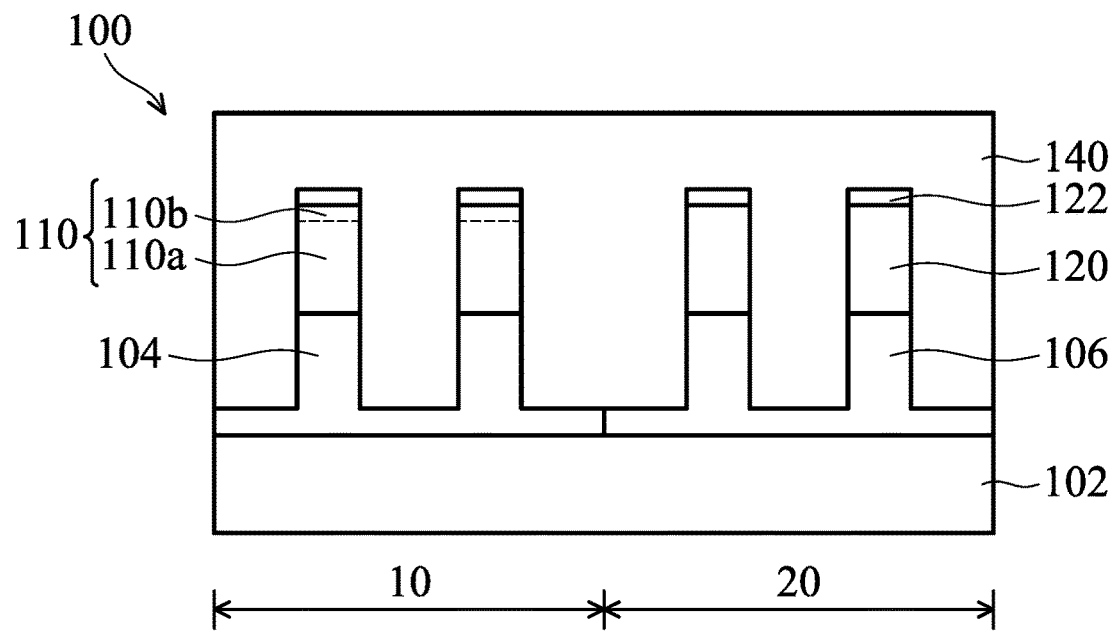

As shown in FIG. 2G, the dielectric layer 140 is formed on the liner layer 130, in accordance with some embodiments. In some embodiments, a dielectric material is deposited on the first fin structure 11, and the second fin structure 12, and afterwards an anneal process is performed on the dielectric material. During the anneal process, the dielectric material is transformed from liquid form into solid form to form the dielectric layer 140.

Figure 2H:
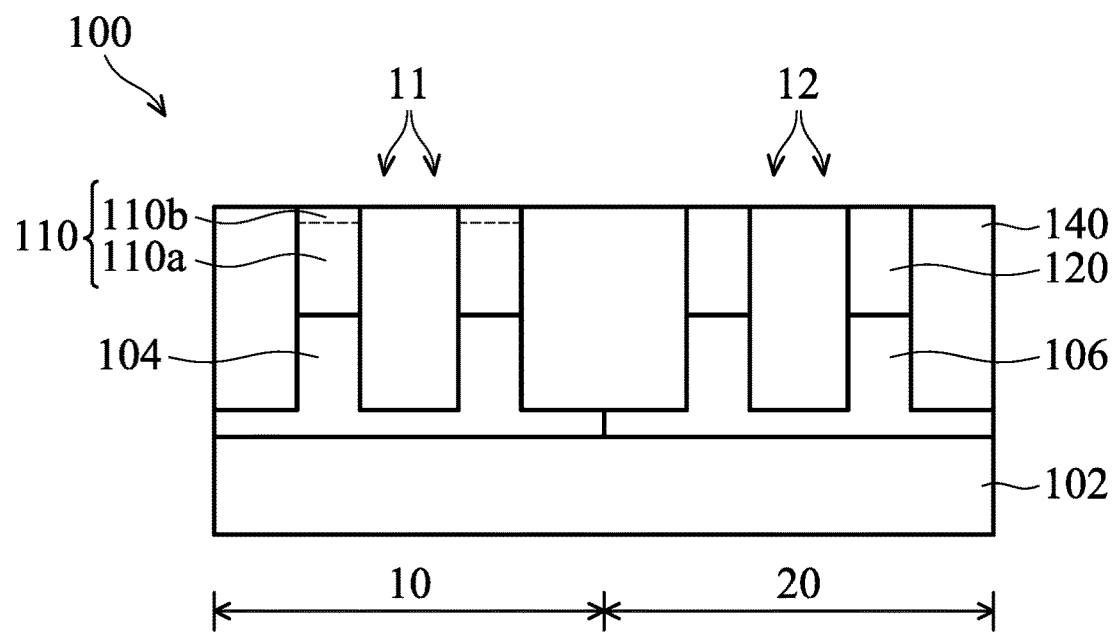

As shown in FIG. 2H, the dielectric layer 140 is thinned or planarized until a top surface of the dielectric layer 140 is level with the top surface of the first material layer 110 and the top surface of the second material layer 120 in accordance with some embodiments. In addition, the oxide layer 122 is removed. In some embodiments, the dielectric layer 208 is thinned by a chemical mechanical polishing (CMP) process.

Figure 2I:
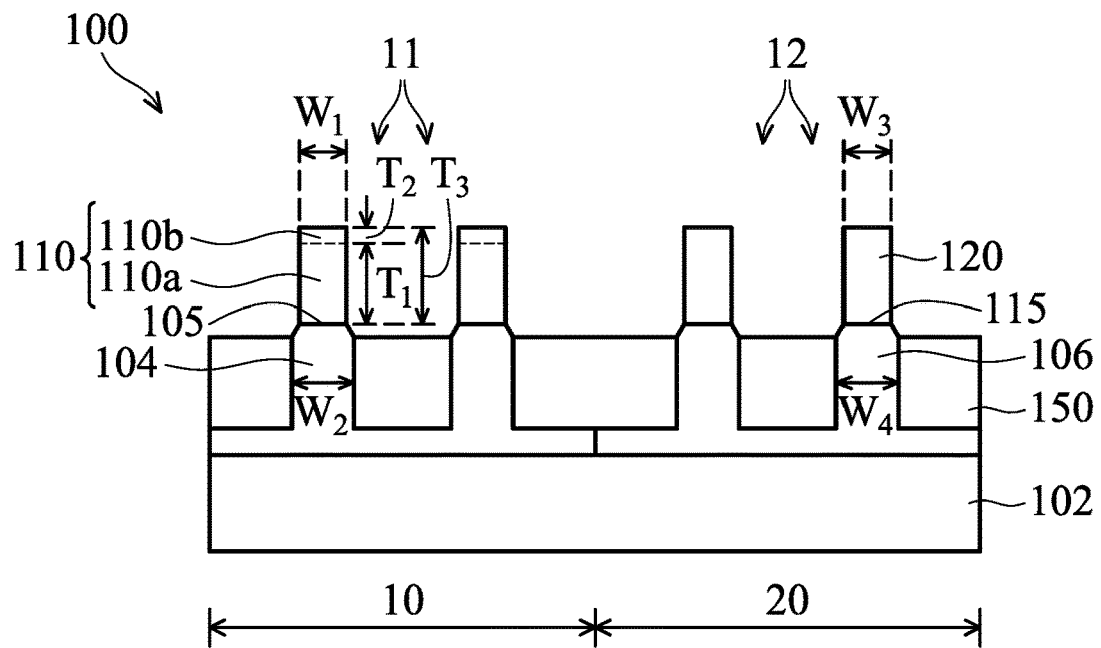

As shown in FIG. 2I, a portion of the dielectric layer 140 is removed to expose the first material layer 110 in the first region 10 and the second material layer 120 in the second region 20, in accordance with some embodiments. As a result, the isolation structure 150 is formed. The dielectric layer 140 is removed by an etching process, such as a dry etching process or a wet etching process. The first interface 105 is higher than the top surface of the isolation structure 150, and the second interface 115 is higher than the top surface of the isolation structure 150.

In some embodiments, the first material layer 110 is slightly removed by the etching process, and therefore the width $W_1$ of the first material layer 110 is smaller than the width $W_2$ of the first well region 104. In some embodiments, the second material layer 120 is slightly removed by the etching process, and therefore the width $W_3$ of the second material layer 120 is smaller than the width $W_4$ of the second well region 106. In addition, a portion of the top portion of the first well region 104 is removed, and a portion of the top portion of the second well region 106 is removed. Therefore, the exposed top portion of the first well region 104 has sloped sidewalls, and the exposed top portion of the second well region 106 has sloped sidewalls.

Figure 2J:
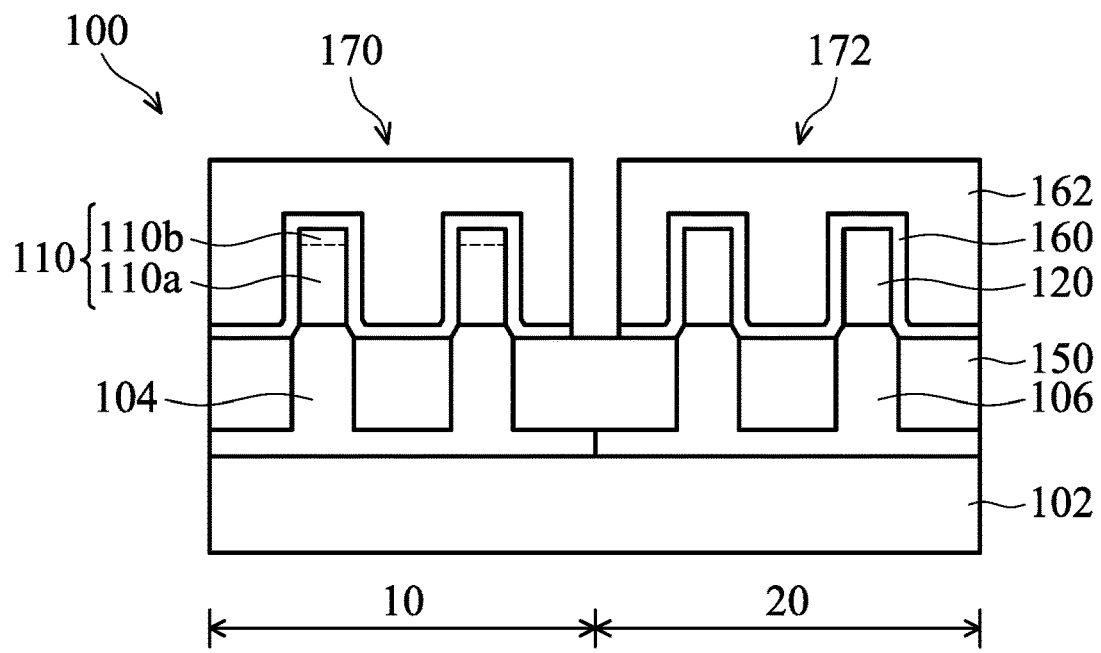

As shown in FIG. 2J, the gate dielectric layer 160 and the gate electrode layer 162 are formed on the isolation structure 150, the first fin structure 11 and the second fin structure 12, in accordance with some embodiments. As a result, the first gate structure 170 is formed on the middle portion of the first fin structure 11 in the first region 10, and the second gate structure 172 is formed on the middle portion of the second fin structure 12 in the second region 20.

Figure 3:
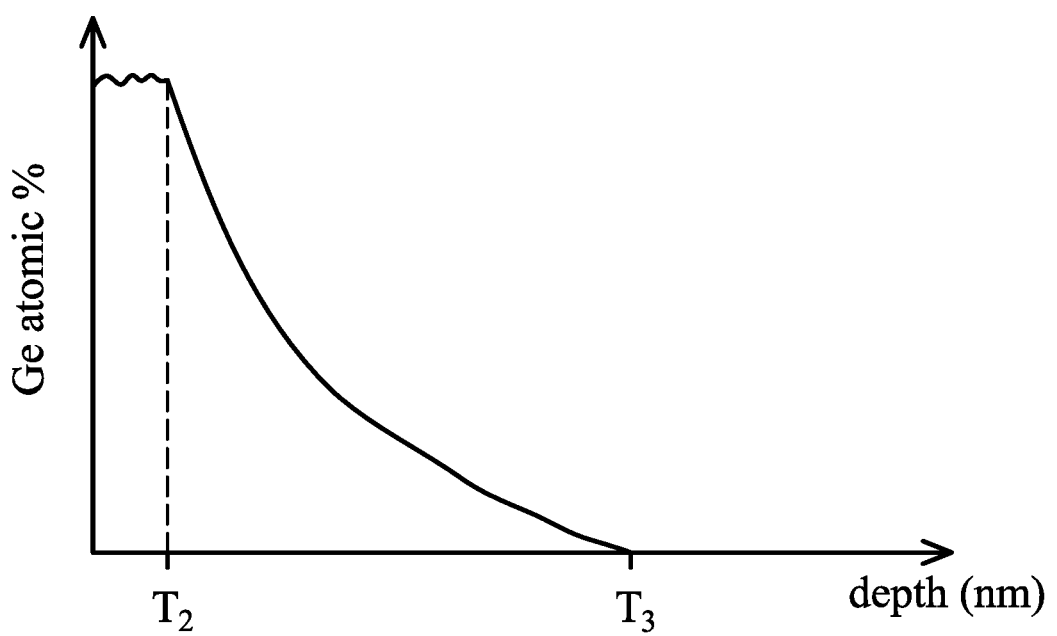
FIG. 3 shows a secondary ion mass spectroscopy (SIMS) profile between the depth and the germanium (Ge) concentration of the first material layer, in accordance with some embodiments.

FIG. 3 shows a secondary ion mass spectroscopy (SIMS) profile between the depth and the germanium (Ge) concentration of the first material layer 110, in accordance with some embodiments. The X-axis shows the depth which is measured from a bottom surface of the gate dielectric layer 160 to a position of the first material layer 110, and the unit of the depth is the nanometer (nm). The Y-axis shows the germanium (Ge) concentration of the first material layer 110, and the unit is atomic percentage (%).

The depth marked in $T_2$ is the thickness of the second portion 110b of the first material layer 110. In the depth range from zero to depth $T_2$, the germanium (Ge) concentration of the second portion 110b is constant. In some embodiments, the constant germanium (Ge) concentration of the second portion 110b is 35 atomic %. The depth marked in $T_3$ is the thickness of the first material layer 110. In the depth range from the depth $T_2$ to the depth $T_3$, the germanium (Ge) concentration of the first portion 110a of the first material layer 110 is gradually decreased. In the range from the depth $T_2$ to the depth $T_3$, the depth and the germanium (Ge) concentration has a linear relationship.

FIGS. 4A-4I show cross-sectional representations of forming a fin field effect transistor (FinFET) device structure 200, in accordance with some embodiments of the disclosure.

Figure 4A:
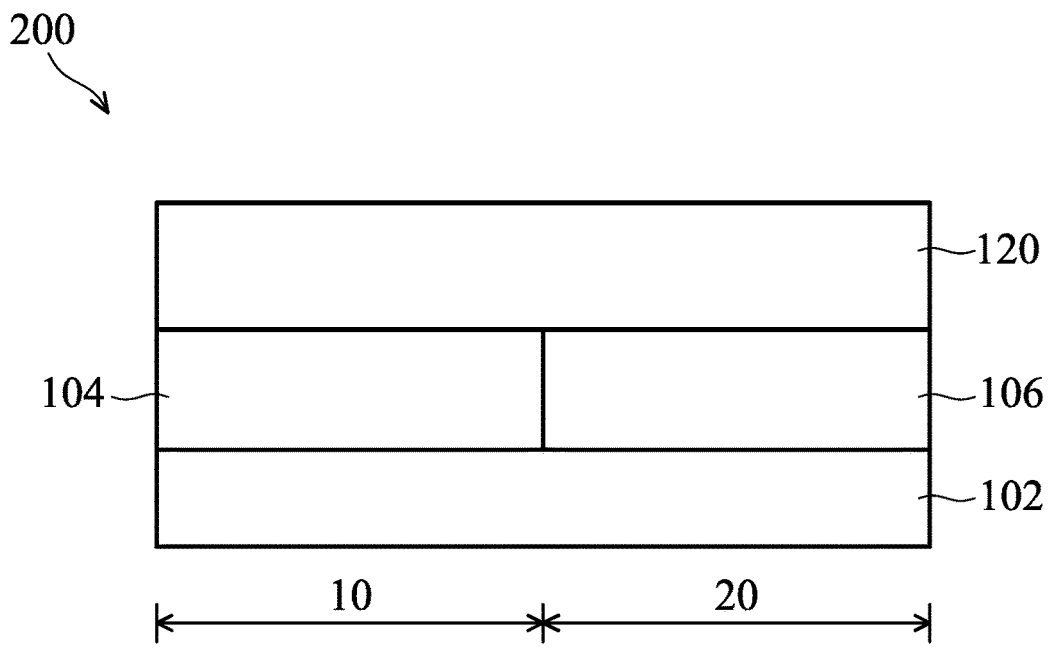
FIGS. 4A-4I show cross-sectional representations of forming a fin field effect transistor (FinFET) device structure, in accordance with some embodiments of the disclosure.

As shown in FIG. 4A, the second material layer 120 is formed on the first well region 104 and the second well region 106, in accordance with some embodiments of the disclosure.

Figure 4B:
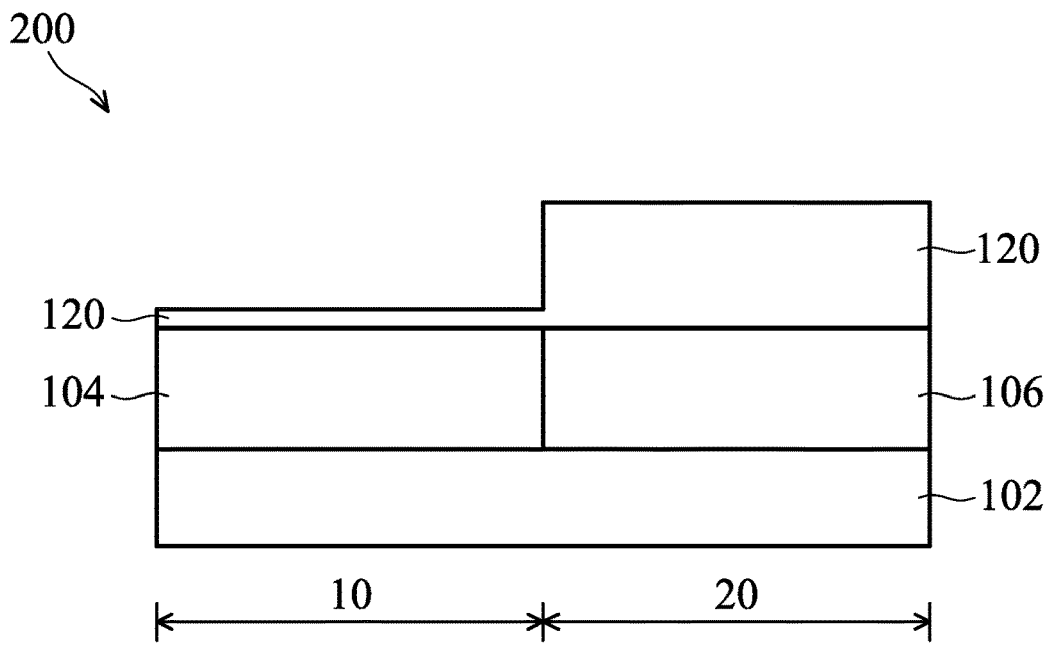

As shown in FIG. 4B, a mask layer (not shown) is formed on the second material layer 120 in the second region 20, and a portion of the second material layer 120 in the first region 10 is removed, in accordance with some embodiments of the disclosure. In some embodiments, the portion of the second material layer 120 in the first region 10 is removed by an etching process. As a result, a top surface of the second material layer 120 in the first region 10 is lower than a top surface of the second material layer 120 in the second region 20. The difference between FIG. 2B and FIG. 4B is that a portion of the second material layer 120 remains on the first well region 104 in FIG. 4B.

Figure 4C:
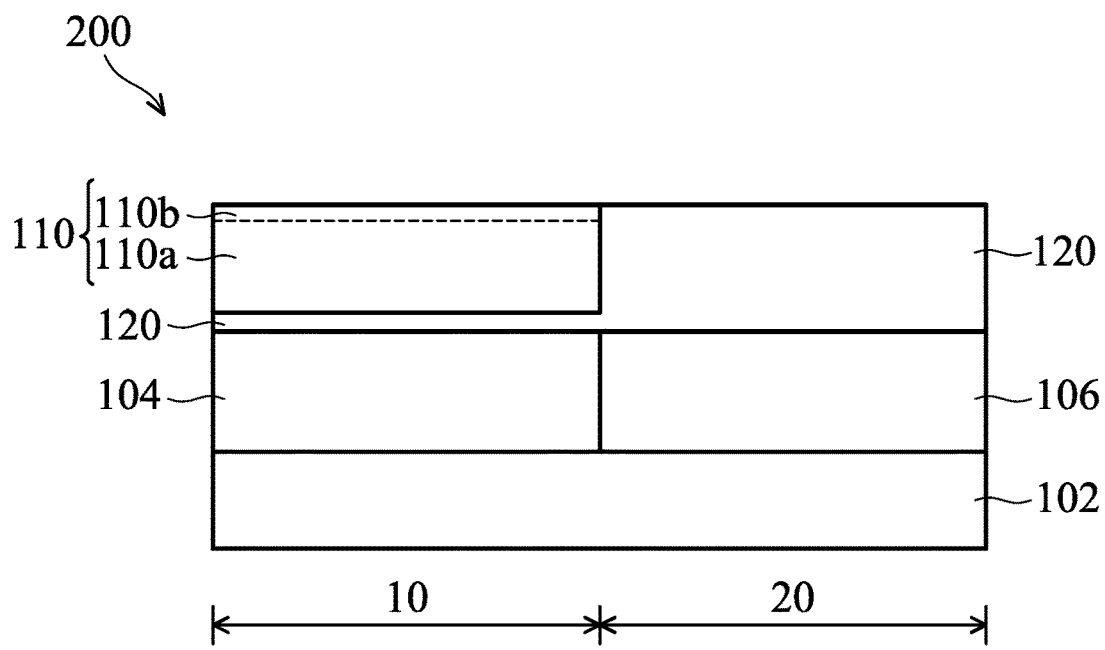

As shown in FIG. 4C, the first material layer 110 is formed on the second material layer 120 in the first region 10, in accordance with some embodiments of the disclosure. The first portion 110a is directly formed on the second material layer 120 in the first region 10, and then the second portion 110b is directly formed on the first portion 110a. The first material layer 110 includes a first portion 110a and a second portion 110b. The first portion 110a has a gradient germanium (Ge) concentration, and the second portion 110b has a constant germanium (Ge) concentration.

Figure 4D:
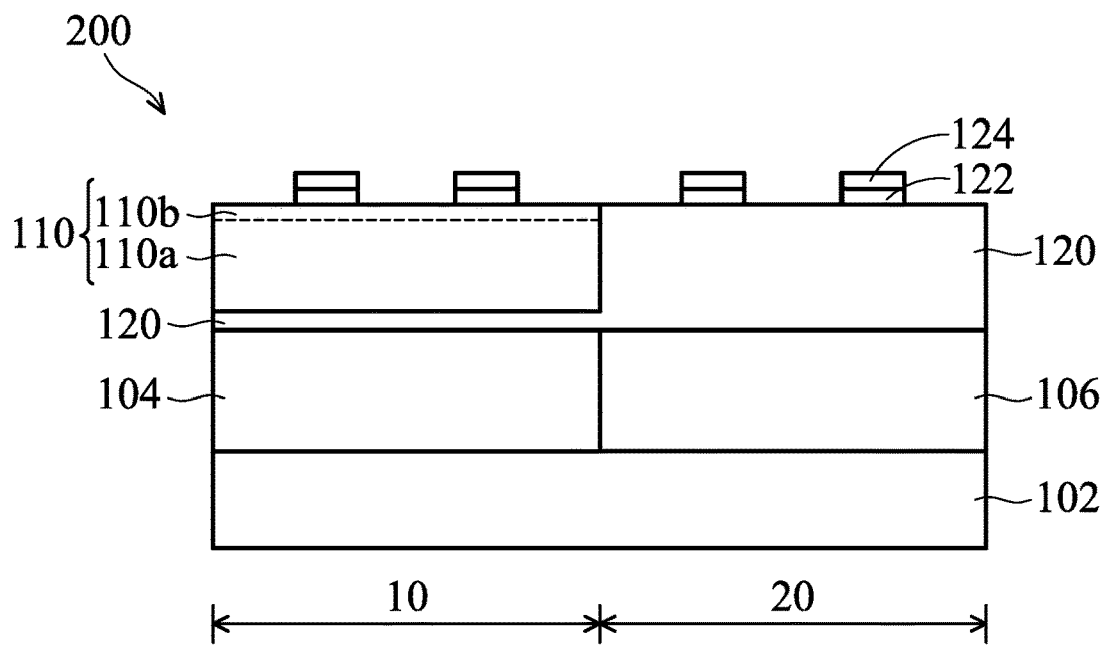

As shown in FIG. 4D, the oxide layer 122 is formed on the first material layer 110 in the first region 10 and the second material layer 120 in the second region 20, in accordance with some embodiments of the disclosure. The hard mask layer 124 is formed on the oxide layer 122. Afterwards, the oxide layer 122 and the hard mask layer 124 are patterned to form a patterned oxide layer 122 and the patterned hard mask layer 124.

Figure 4E:
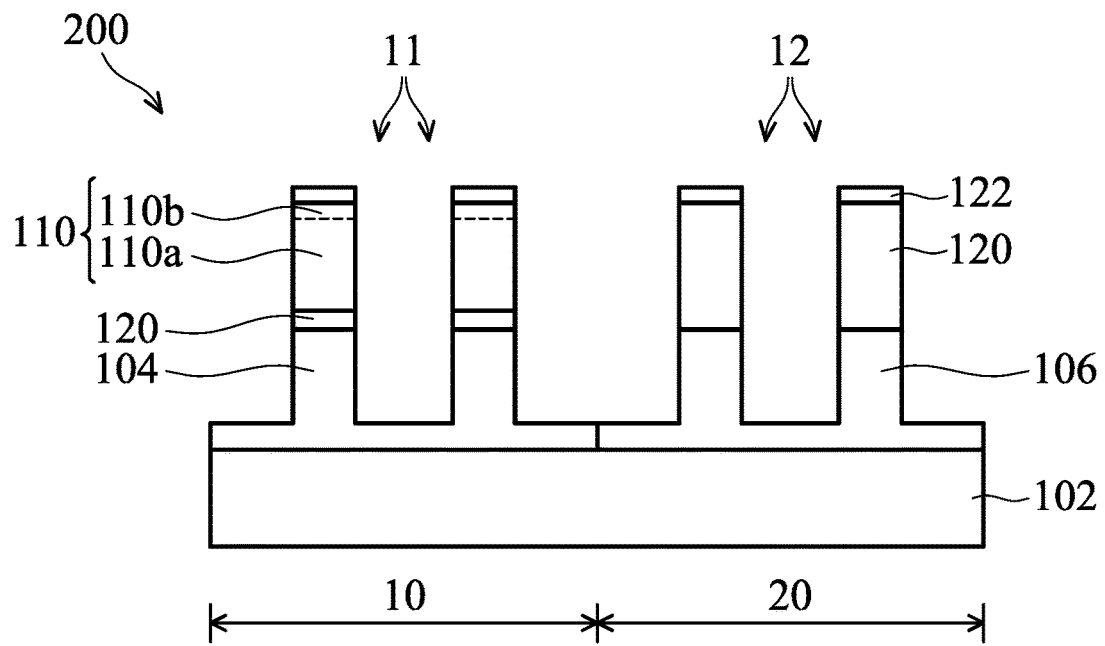

As shown in FIG. 4E, an etching process is performed on the first material layer 110, the first well region 104, the second material layer 120 and the second well region 106 to form a first fin structure 11 and a second fin structure 12, in accordance with some embodiments of the disclosure. Afterwards, the patterned hard mask layer 124 is removed.

Figure 4F:
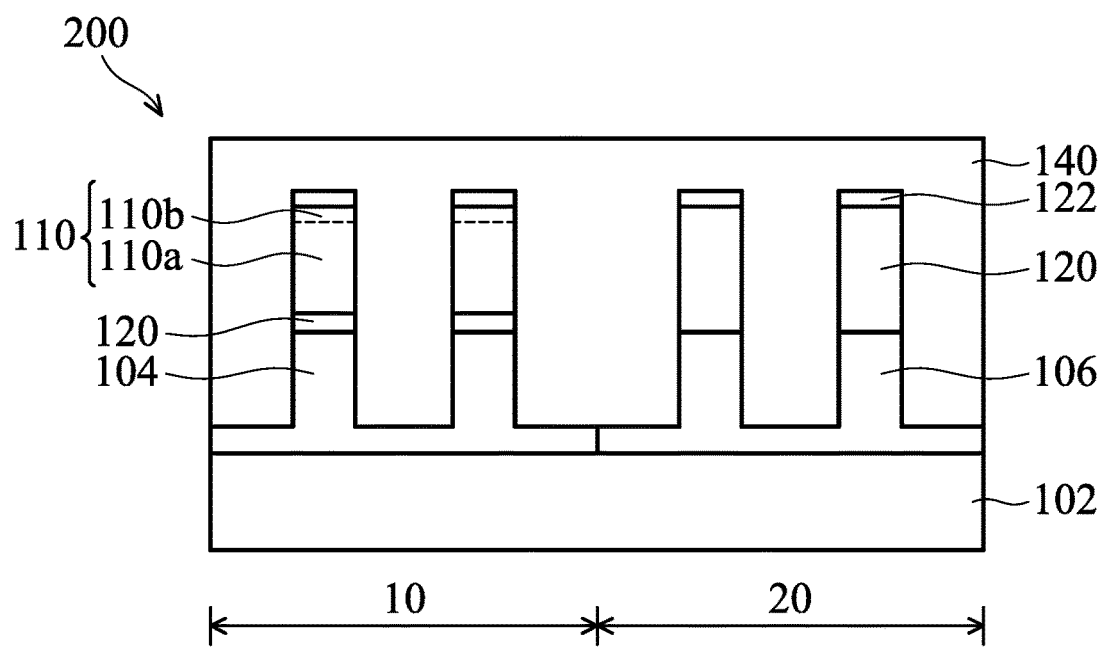

As shown in FIG. 4F, the dielectric layer 140 is formed on the first fin structure 11 and the second fin structure 12, in accordance with some embodiments.

Figure 4G:
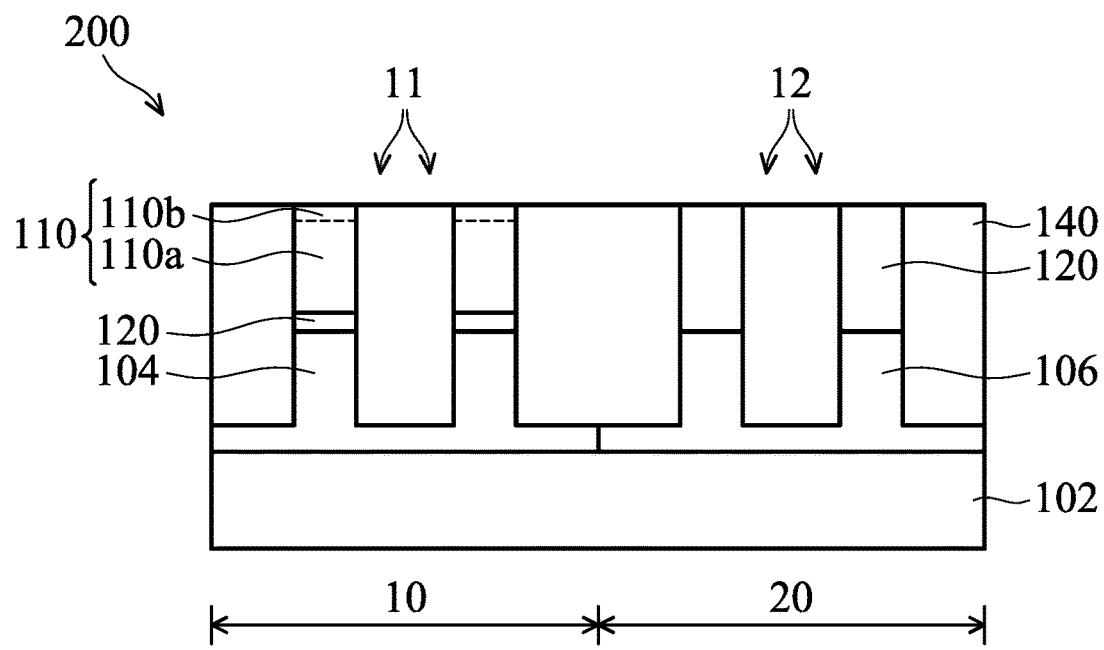

As shown in FIG. 4G, the dielectric layer 140 is thinned or planarized until a top surface of the dielectric layer 140 is level with a top surface of the second portion 110b of the first material layer 110 and a top surface of the second material layer 120, in accordance with some embodiments.

Figure 4H:
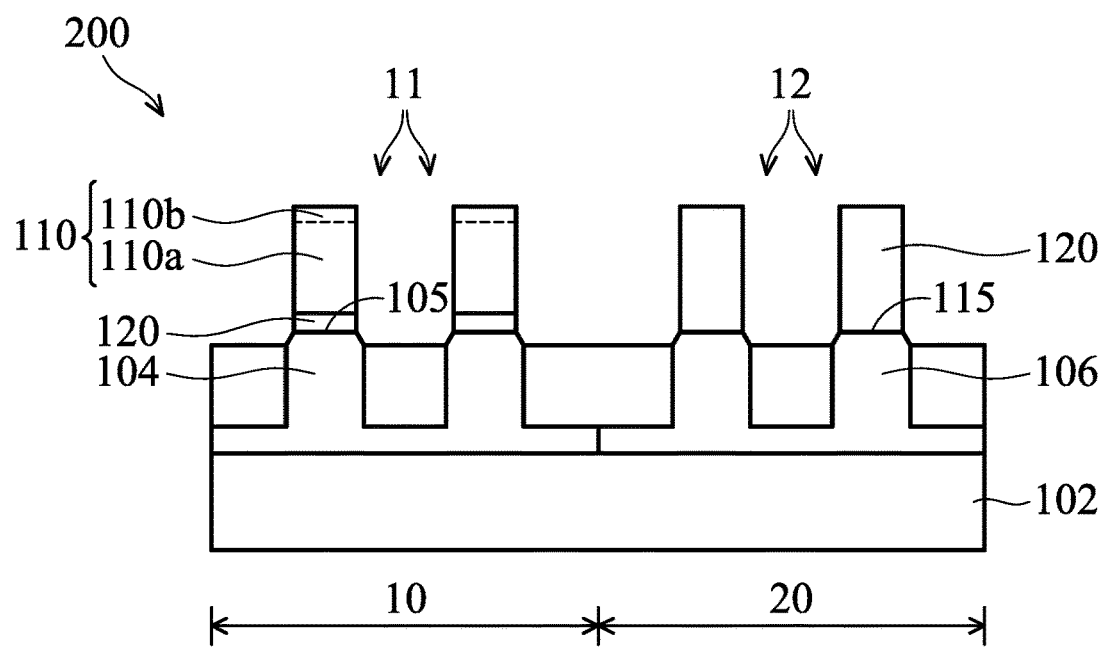

As shown in FIG. 4H, a portion of the dielectric layer 140 is removed to expose the first material layer 110 in the first region 10 and the second material layer 120 in the second region 20, in accordance with some embodiments. As a result, an isolation structure 150 is formed. In some embodiments, a portion of the first material layer 110 and a portion of the second material layer 120 are removed, and thus the width of the first material layer 110 is smaller than the width of the first well region 104, and the width of the second material layer is smaller than the width of the second well region 106. A top portion of the first well region 104 has a pair of sloped sidewalls above the isolation structure 150, and a top portion of the second well region 106 has a pair of sloped sidewalls above the isolation structure 150.

Figure 4I:
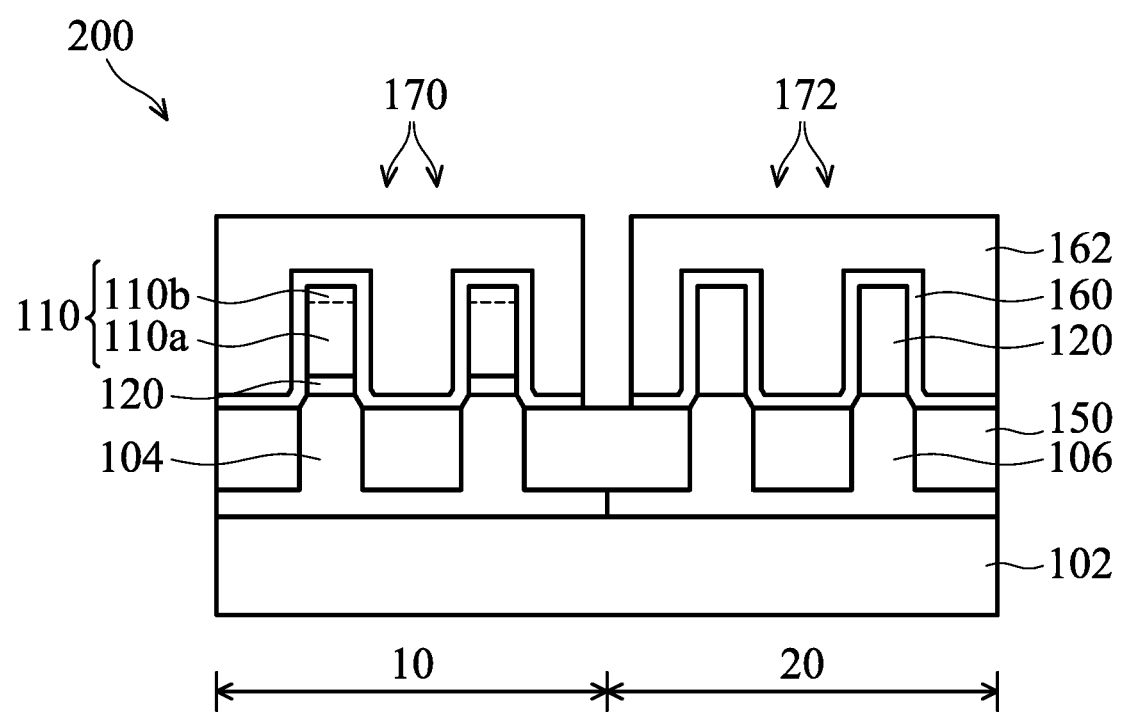

As shown in FIG. 4I, the gate dielectric layer 160 and the gate electrode layer 162 are formed on the first material layer 110, the second material layer 120 and the isolation structure 150, in accordance with some embodiments. As a result, a first gate structure 170 is formed on the middle portion of the first fin structure 11 in the first region 10, and a second gate structure 172 is formed on the middle portion of the second fin structure 12 in the second region 20. The gate dielectric layer 160 has sloped bottom portions which are directly over the sloped portion of the first well region 104 and the sloped portion of the second well region 106.

FIGS. 5A-5F show cross-sectional representations of forming a fin field effect transistor (FinFET) device structure 300, in accordance with some embodiments of the disclosure.

Figure 5A:
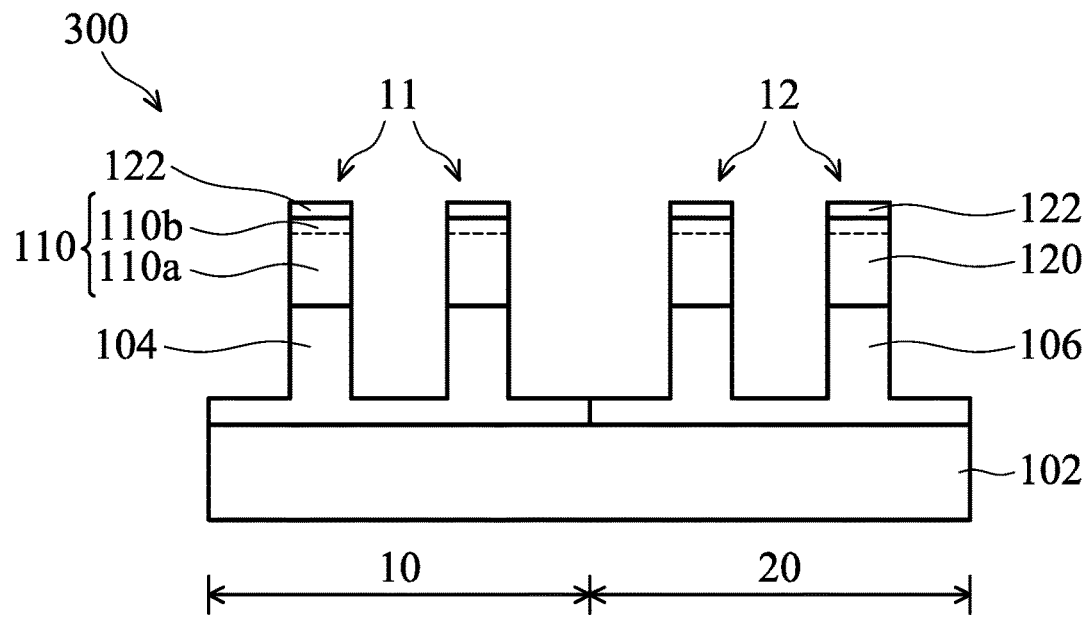
FIGS. 5A-5F show cross-sectional representations of forming a fin field effect transistor (FinFET) device structure, in accordance with some embodiments of the disclosure.

As shown in FIG. 5A, the first fin structure 11 and the second fin structure 12 are formed on the substrate 102, in accordance with some embodiments of the disclosure.

Figure 5B:
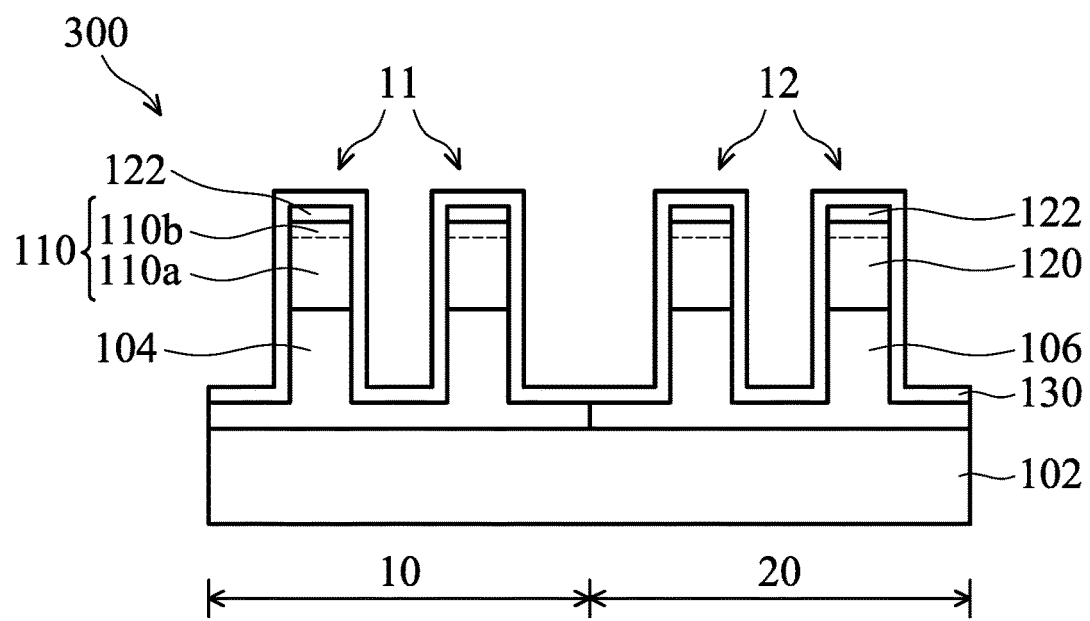

As shown in FIG. 5B, a liner layer 130 is formed on the first fin structure 11 and the second fin structure 12, in accordance with some embodiments of the disclosure. More specifically, the liner layer 130 is conformally formed on the sidewalls, top surface of first fin structure 11 and the second fin structure 12, and on the first material layer 104 and the second material layer 106.

The liner layer 130 is used to protect the first fin structure 11 and the second fin structure 12 from being damaged by the following processes (such as an anneal process or an etching process). Therefore, the profiles or shapes of the first fin structure 11 and the second fin structure 12 are maintained or preserved by the protection of the liner layer 130. In order to protect the underlying first fin structure 11 and the second fin structure 12, the liner layer 130 has a Young's modulus in a range from about 200 GPa to about 1000 GPa. When the Young's modulus of the liner layer 130 is within the above-mentioned range, the liner layer 130 is robust or rigid enough to protect the underlying structures. The liner layer 130 is made of nitrogen-containing material, carbon-containing material or a combination thereof. In some embodiments, the liner layer 130 is made of silicon nitride, silicon carbide (SiC), silicon oxynitride, silicon oxycarbide (SiOC) or a combination thereof.

In some embodiments, the liner layer 130 is not made of oxide, such as silicon oxide. If the liner layer 130 made of silicon oxide, the liner layer 130 is not robust enough to protect the first fin structure 11 and the second fin structure 12, especially when the fin structure includes silicon germanium (SiGe).

Figure 5C:
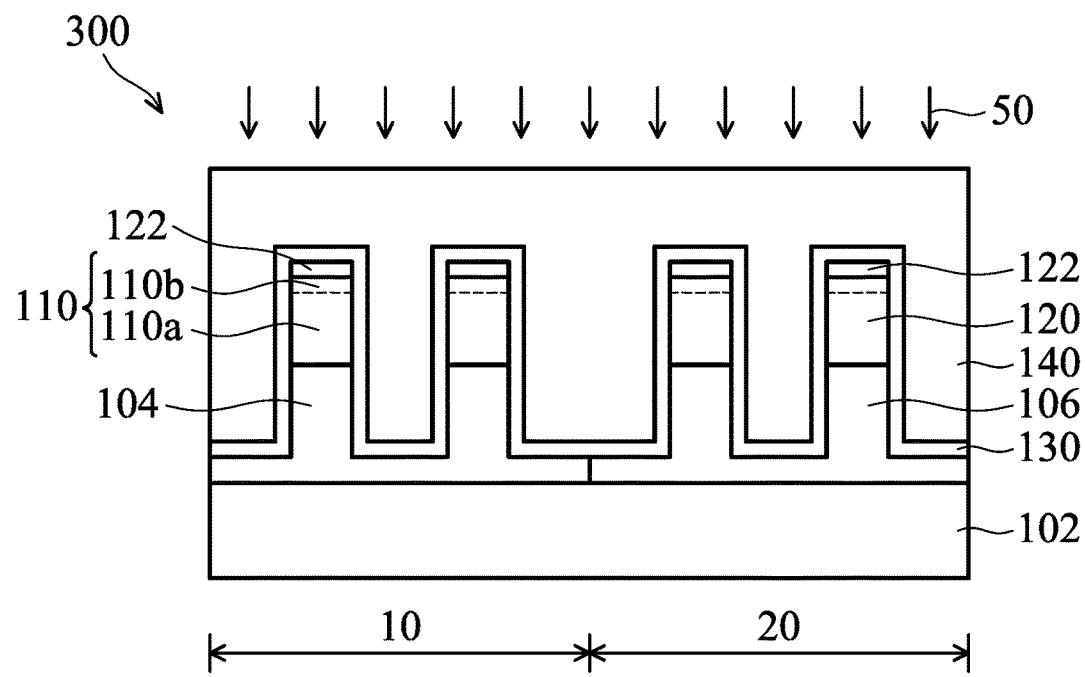

As shown in FIG. 5C, the dielectric layer 140 is formed on the liner layer 130, in accordance with some embodiments. In some embodiments, a dielectric material is deposited on the first fin structure 11, the second fin structure 12 and the liner layer 130, and afterwards an anneal process 50 is performed on the dielectric material. During the anneal process 50, the dielectric material is transformed from liquid form into solid form to form the dielectric layer 140.

Figure 5D:
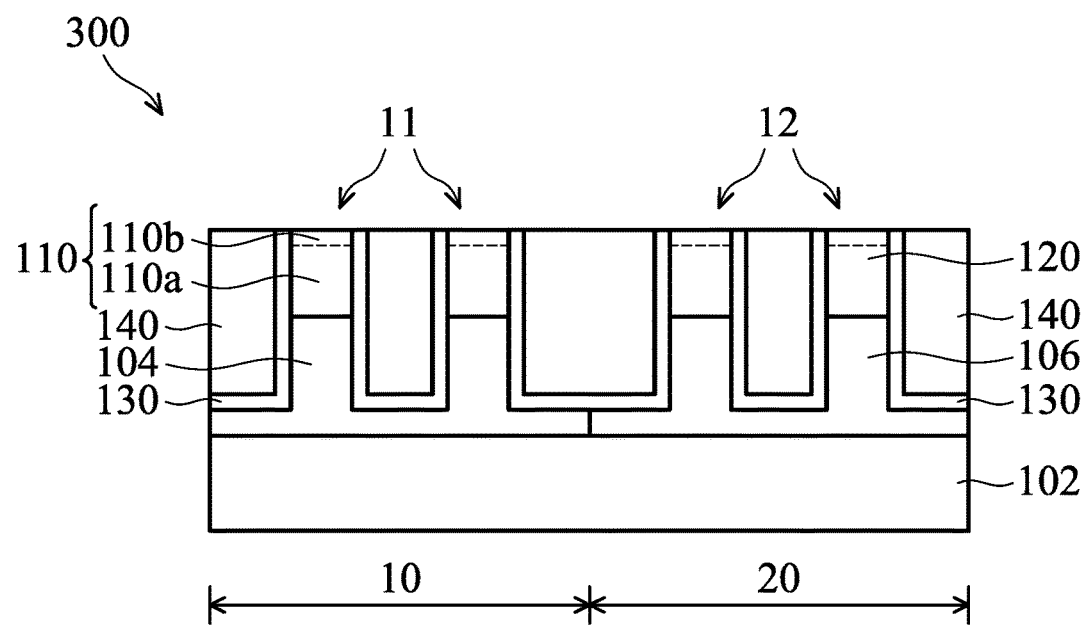

As shown in FIG. 5D, the dielectric layer 140 is thinned or planarized until a top surface of the dielectric layer 140 is level with the top surface of the first material layer 110 and the top surface of the second material layer 120, in accordance with some embodiments. In addition, the oxide layer 122 is removed.

Figure 5E:
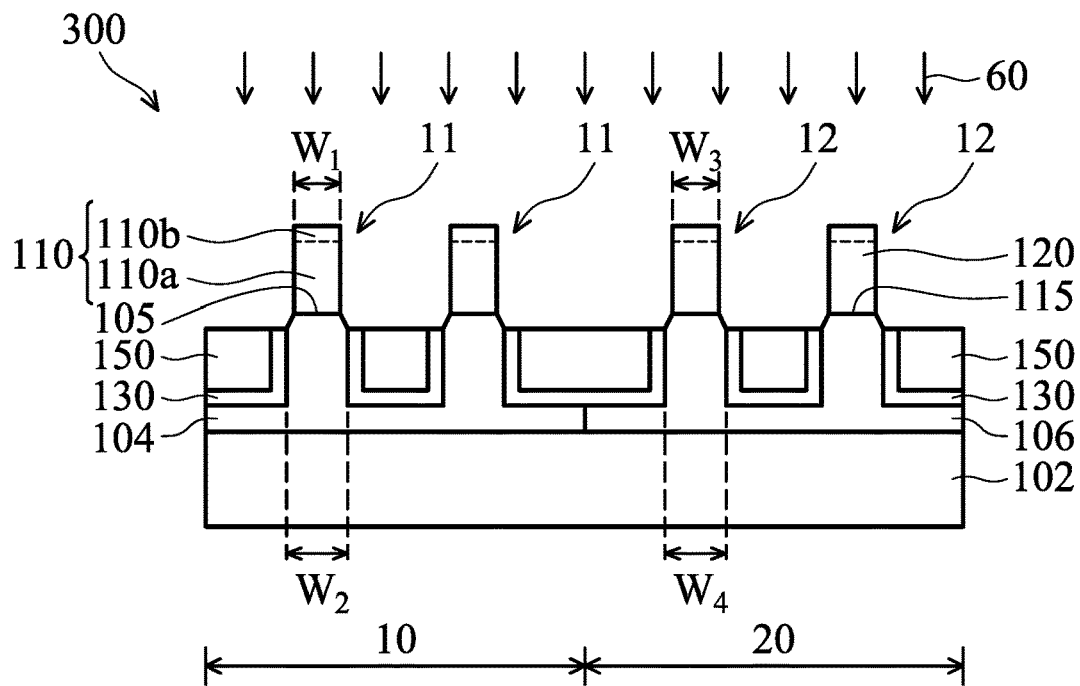

As shown in FIG. 5E, a portion of the dielectric layer 140 is removed to expose the first material layer 110 in the first region 10 and the second material layer 120 in the second region 20, in accordance with some embodiments. As a result, the isolation structure 150 is formed. In some embodiments, the dielectric layer 140 is removed by an etching process 60, such as a dry etching process or a wet etching process.

The liner layer 130 is formed on sidewalls of the first well region 104 and the sidewalls of the second well region 106. The liner layer 130 is extended from the sidewalls of the first well region 104 to the sidewalls of the second well region 106. Therefore, the isolation structure 150 is surrounded by the liner layer 130.

Figure 5F:
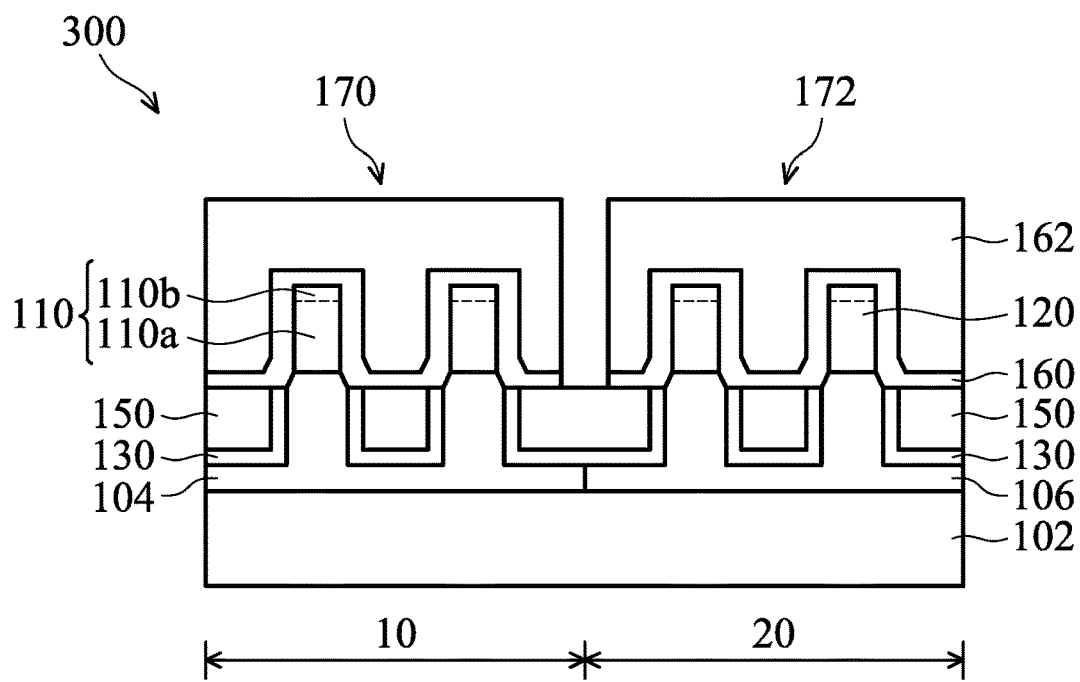

As shown in FIG. 5F, the gate dielectric layer 160 and the gate electrode layer 162 are formed on the isolation structure 150, the liner layer 130, the first fin structure 11 and the second fin structure 12, in accordance with some embodiments. As a result, the first gate structure 170 is formed on the middle portion of the first fin structure 11 in the first region 10, and the second gate structure 172 is formed on the middle portion of the second fin structure 12 in the second region 20. The gate dielectric layer 160 is between the liner layer 130 and the gate electrode layer 162.

The second portion 110b of the first material layer 110 is made of silicon germanium (SiGe), and the silicon germanium (SiGe) has a gradient germanium (Ge) concentration to decrease the defects and prevent the profiles or shapes of the fin structures 11, 12 from being wiggled or bent. In addition, the liner layer 130 is used to protect the fin structures 11, 12 from being damaged during the etching process or annealing process. By using the first material layer 110 with a gradient germanium (Ge) concentration and the rigid liner layer, the profiles or shapes of the fin structures 11, 12 may be maintained and are not wiggled or bent.

Embodiments for forming a fin field effect transistor (FinFET) device structure are provided. A fin structure is formed on a substrate, and the gate structure above a portion of the fin structure. The portion of the fin structure wrapped by the gate structure is used as a channel region. The channel region includes a first portion and a second portion above the first portion. The first portion of the channel region has a gradient germanium (Ge) concentration, and the second portion of the channel region has a constant germanium (Ge) concentration. The advantage of the gradient germanium (Ge) concentration is to reduce the defects in the channel region, and the advantage of the constant germanium (Ge) concentration is to improve the stability of the threshold voltage ($V_{th}$) of the fin field effect transistor (FinFET) device structure. Therefore, the performance of fin field effect transistor (FinFET) device structure is improved.

In some embodiments, a fin field effect transistor (FinFET) device structure is provided. The FinFET device structure includes a fin structure extending above a substrate. The fin structure includes a channel region, a portion of the channel region is made of silicon germanium (SiGe), and the silicon germanium (SiGe) has a gradient germanium (Ge) concentration. The FinFET device structure includes a gate structure formed on the channel region of the fin structure.

In some embodiments, a fin field effect transistor (FinFET) device structure is provided. The FinFET device structure includes a fin structure extending above a substrate. The fin structure includes a channel region, the channel region has a first portion and a second portion above the first portion, the first portion has a gradient germanium (Ge) concentration, and the second portion has a constant germanium (Ge) concentration. The FinFET device structure also includes a gate dielectric layer formed on the channel region of the fin structure.

In some embodiments, a fin field effect transistor (FinFET) device structure is provided. The FinFET device structure includes a substrate a substrate, and the substrate includes a first region and a second region. The FinFET device further includes a first fin structure extending above the first region of the substrate, and the first fin structure includes a first channel region. The first channel region includes a first portion made of silicon germanium (SiGe) with a gradient germanium (Ge) concentration. The FinFET device also includes a second fin structure extending above the second region of the substrate, and the second fin structure includes a second channel region, and the second channel region is made of silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a fin structure extending above a substrate, wherein the fin structure comprises a channel region, a well region below the channel region, and a silicon layer that is made of only silicon (Si) material and is between the channel region and the well region, a portion of the channel region is made of silicon germanium (SiGe), and the silicon germanium (SiGe) has a gradient germanium (Ge) concentration; and
   a gate structure formed on the channel region of the fin structure, wherein a top surface and sidewall surfaces of the channel region are wrapped by the gate structure, and the top surface of the channel region is higher than a top surface of the well region, and wherein sidewall surfaces of the silicon layer are wrapped by the gate structure.

2. The fin field effect transistor (FinFET) device structure as claimed in claim 1, wherein the gradient germanium (Ge) concentration is gradually increased from a bottom surface of the channel region to a top surface of the channel region.

3. The fin field effect transistor (FinFET) device structure as claimed in claim 1, wherein the gradient germanium (Ge) concentration is gradually increased from 10 atomic % to 35 atomic %.

4. The fin field effect transistor (FinFET) device structure as claimed in claim 1, further comprises:
   an isolation structure formed on the substrate, wherein an interface between the channel region and the well region of the fin structure is above a top surface of the isolation structure.

5. The fin field effect transistor (FinFET) device structure as claimed in claim 1, further comprising:
   a liner layer formed on a sidewall of the well region of the fin structure, and the liner layer is made of nitrogen-containing material, carbon-containing material or a combination thereof.

6. The fin field effect transistor (FinFET) device structure as claimed in claim 4, wherein the well region has a pair of sloped sidewalls above the isolation structure.

7. A fin field effect transistor (FinFET) device structure, comprising:
   an isolation structure formed on the substrate;
   a fin structure extending above a substrate, wherein the fin structure comprises a channel region, a well region below the channel region, and a silicon layer that is made of only silicon (Si) material and is between the channel region and the well region, the channel region has a first portion and a second portion above the first portion, the first portion has a gradient germanium (Ge) concentration, and the second portion has a constant germanium (Ge) concentration, and a sloped sidewall of the well region protrudes from the isolation structure and extends directly from and above an interface of the well region and the isolation structure, and wherein a bottom surface of the silicon layer is higher than a top surface of the isolation structure; and
   a gate dielectric layer formed on the channel region of the fin structure, wherein a top surface and sidewall surfaces of the channel region are wrapped by the gate dielectric layer.

8. The fin field effect transistor (FinFET) device structure as claimed in claim 7, wherein the channel region is made of silicon germanium (SiGe), and the gradient germanium (Ge) concentration is gradually increased from 10 atomic % to 35 atomic %.

9. The fin field effect transistor (FinFET) device structure as claimed in claim 7, wherein the well region is an N-well region, and the gate dielectric layer is in direct contact with the sloped sidewall of the N-well region.

10. The fin field effect transistor (FinFET) device structure as claimed in claim 9, wherein an interface between the channel region and the N-well region of the fin structure is above a top surface of the isolation structure.

11. A fin field effect transistor (FinFET) device structure, comprising:
   a substrate, wherein the substrate comprises a first region and a second region;
   an isolation structure formed on the substrate;
   a first fin structure extending above the first region of the substrate, wherein the first fin structure comprises a first channel region and a well region below the first channel region, the first channel region comprises a first portion made of silicon germanium (SiGe) with a gradient germanium (Ge) concentration;
   a first gate structure formed on the first channel region of the first fin structure, wherein a top surface and sidewall surfaces of the first channel region are wrapped by the first gate structure;
   a second fin structure extending above the second region of the substrate, wherein the second fin structure comprises a second channel region, and the second channel region is made of silicon;
   a second gate structure formed on the second channel region of the second fin structure, wherein a top surface and sidewall surfaces of the second channel region are wrapped by the second gate structure; and
   a liner layer extending from sidewalls of the first fin structure to sidewalls of the second fin structure, wherein the liner layer is below the first channel region and the second channel region, and wherein a sloped sidewall of the well region extends directly from and above a topmost surface of the liner layer.

12. The fin field effect transistor (FinFET) device structure as claimed in claim 11, wherein the well region of the first fin structure is an N-well region, the second fin structure further comprises a P-well region, and the P-well region has a second sloped sidewall.

13. The fin field effect transistor (FinFET) device structure as claimed in claim 12,
   wherein the isolation structure is formed between the first fin structure and the second fin structure, and the isolation structure is surrounded by the N-well region and the P-well region.

14. The fin field effect transistor (FinFET) device structure as claimed in claim 12, further comprising:
   a gate dielectric layer formed on a middle portion of the fin structure, wherein the gate dielectric layer has a sloped bottom portion in contact with the sloped sidewall of the N-well region; and
   a gate electrode layer formed on the gate dielectric layer.

15. The fin field effect transistor (FinFET) device structure as claimed in claim 11, wherein the first channel region further comprises a second portion above the first portion, and the second portion is made of silicon germanium (SiGe) with a constant germanium (Ge) concentration.

16. The fin field effect transistor (FinFET) device structure as claimed in claim 1, wherein a width of the channel region is smaller than a width of the well region.

17. The fin field effect transistor (FinFET) device structure as claimed in claim 9, wherein the N-well region is vertically overlapped with the gate dielectric layer.

18. The fin field effect transistor (FinFET) device structure as claimed in claim 7, wherein the first portion has a first thickness, the second portion has a second thickness, and a ratio of the second thickness to the first thickness is in a range from 1% to 10%.

19. The fin field effect transistor (FinFET) device structure as claimed in claim 1, wherein the gate structure comprises a gate dielectric layer and a gate electrode layer on the gate dielectric layer, and the silicon layer is in direct contact with the gate dielectric layer.

20. The fin field effect transistor (FinFET) device structure as claimed in claim 5, wherein a sloped sidewall of the well region extends directly from and above a topmost surface of the liner layer.

* * * * *